(12) United States Patent
Zhuravleva et al.

(10) Patent No.: US 8,815,119 B2
(45) Date of Patent: *Aug. 26, 2014

(54) CHLORIDE, BROMIDE AND IODIDE SCINTILLATORS WITH EUROPIUM DOPING

(75) Inventors: Mariya Zhuravleva, Knoxville, TN (US); Kan Yang, Solon, OH (US)

(73) Assignee: University of Tennessee Research Foundation, Knoxville, TN (US)

(*) Notice: Subject to any disclaimer, the term of this patent is extended or adjusted under 35 U.S.C. 154(b) by 145 days.

This patent is subject to a terminal disclaimer.

(21) Appl. No.: 13/351,748

(22) Filed: Jan. 17, 2012

(65) Prior Publication Data

US 2012/0273726 A1 Nov. 1, 2012

Related U.S. Application Data

(63) Continuation-in-part of application No. 13/098,654, filed on May 2, 2011.

(60) Provisional application No. 61/443,076, filed on Feb. 15, 2011, provisional application No. 61/491,074, filed on May 27, 2011, provisional application No. 61/332,945, filed on May 10, 2010.

(51) Int. Cl.
| | |
|---|---|
| *C09K 11/61* | (2006.01) |
| *C09K 11/77* | (2006.01) |
| *C30B 29/12* | (2006.01) |
| *C30B 11/00* | (2006.01) |
| *C04B 35/645* | (2006.01) |
| *C04B 35/515* | (2006.01) |

(52) U.S. Cl.
CPC ......... *C09K 11/7733* (2013.01); *C09K 11/7791* (2013.01); *C04B 2235/3215* (2013.01); *C04B 2235/3224* (2013.01); *C04B 2235/3213* (2013.01); *C30B 29/12* (2013.01); *C30B 11/00* (2013.01); *C04B 35/6455* (2013.01); *C04B 2235/3201* (2013.01); *C04B 35/5152* (2013.01)
USPC .................................. 252/301.4 H; 117/940

(58) Field of Classification Search
USPC ............ 252/301.4 H; 117/940; 423/263, 463, 423/466
See application file for complete search history.

(56) References Cited

U.S. PATENT DOCUMENTS 4,740,699 A * 4/1988 Miura et al. ................... 250/586
6,369,391 B1 * 4/2002 Hefetz et al. ................... 250/368

(Continued)

FOREIGN PATENT DOCUMENTS

| EP | 2060614 | * | 4/1988 |
| EP | 2387040 | | 11/2011 |
| IN | 2009MU00080 | * | 7/2010 |

OTHER PUBLICATIONS

Chemical Abstract citation 1982:151979: Vishnevskii et al, "Luminescence of europium(2+)-activated cesium calcium chloride single crystals", Izvestiya Vysshikh Uchebnykh Zavedenii, Fizika (1982), 25 (1), pp. 91-92.*

(Continued)

*Primary Examiner* — Carol M Koslow
(74) *Attorney, Agent, or Firm* — Cameron LLP

(57) ABSTRACT

A halide scintillator material is disclosed where the halide may comprise chloride, bromide or iodide. The material is single-crystalline and has a composition of the general formula $ABX_3$ where A is an alkali, B is an alkali earth and X is a halide which general composition was investigated. In particular, crystals of the formula $ACa_{1-y}Eu_yI_3$ where A=K, Rb and Cs were formed as well as crystals of the formula $CsA_{1-y}Eu_yX_3$ (where A=Ca, Sr, Ba, or a combination thereof and X=Cl, Br or I or a combination thereof) with divalent Europium doping where $0 \leq y \leq 1$, and more particularly Eu doping has been studied at one to ten mol %. The disclosed scintillator materials are suitable for making scintillation detectors used in applications such as medical imaging and homeland security.

8 Claims, 17 Drawing Sheets

(56) References Cited

U.S. PATENT DOCUMENTS

| | | | |
|---|---|---|---|
| 2005/0061992 A1* | 3/2005 | Kasai et al. | 250/484.4 |
| 2005/0072937 A1* | 4/2005 | Kondo et al. | 250/484.4 |
| 2006/0163538 A1* | 7/2006 | Schierning et al. | 252/301.4 H |
| 2007/0036893 A1* | 2/2007 | Tahon et al. | 427/248.1 |
| 2011/0024635 A1 | 2/2011 | Shah et al. | |
| 2011/0165422 A1 | 7/2011 | Gundiah et al. | |
| 2011/0272585 A1 | 11/2011 | Yang et al. | |
| 2011/0272586 A1 | 11/2011 | Yang et al. | |
| 2012/0001282 A1* | 1/2012 | Goto et al. | 257/429 |
| 2012/0193539 A1* | 8/2012 | Bizarri et al. | 250/361 R |

OTHER PUBLICATIONS

Xinhau et al, "Fluorence spectra of ARE2I5 and AREI3 in the solid state (A=K,Rb,Cs,TI;RE=Sm,Eu)", Journ alloys and compound, 180 (1992), pp. 235-238.*

Baopeng et al, "Synthesis and structure of AEuI3 (A=Rb, Cs) and AEu2I5 (A=K,Rb,Cs)",Journ alloys and compound, 181 (1992), pp. 511-514.*

Seifert et al, "Strsucture and Stability of the Low-Temperature Modifiation of Compounds Cs3LnCl6 (Ln=La-gd)", Journal of Solid State Chemistry, vol. 107, issue 1, Nov. 1993, pp. 19-26.*

P.A. Rodnyi, "Efficiency and Yield Spectra of Inorganic Scintillates", Radiation Measurements, vol. 29, No. 3-4, 1998, pp. 235-242.*

Chemical Abstract citation 2006:757179: Bao et al, "Phase diagram of the CsBr-CaBr2 system", Rare Metals (Beijing China) 2006, 25 (3), pp. 293-296.*

Gahane et al, "Luminescence of some Eu2 activated bromides", Journ alloys and compound, 484 (2009), pp. 660-664.*

Glodo, et al, "Cs2LiYCl6:Ce Scintillator for Nuclear Montoring Applications", IEEE Transactions on Nuclear Science, vol. 56, No. 3, Jun. 1, 2009, pp. 1257-1261.*

Hawrami et al, "Advanced Scintillator Materials for Nuclear Radiation Detectin", Alabama A&M University Science, Technology, Engineering & Mathematics Day Apr. 11, 2008, pp. 55-56.*

Bessiere et al, "Scintillation and Anomalous Emission in Elpasolite Cs2LiLuCl6:Ce3+", Journal of Luminescence 117 (2206, pp. 187-198.*

Belikov, K.N., "Analytical Control of Ce Content in CsCexGd2-xCl7 Single Crystals by Inductively Coupled Plasma Atomic Emission Spectrometry", abstract, retrieved from STN database No. 2009-60516 XP002643847, 2008.*

Rooh et al, "The Growth and Scintillation Properties of CsCe2Cl7 Crystals", Journal of Crystal Growth, 311 (2008), pp. 128-131.*

Meyer, G.,"The Reduction of Rare-Earth Metal Halide with Unlike Metals-Woehler's Metallothermic Reduction", Z Anog, Allg. Chem., vol. 633, Jan. 1, 2007, pp. 2537-2552.*

Karbowiak et al, "Energy Transfer and Upconversion of Nd3+ doped RbY2Cl7", Journal of Luminescence, 104, (2003) pp. 197-205.*

Knoll, Glenn F. "Radiation Detection and Measurement", General Properties of Radiation Detectors, pp. 95-103; New York (1979).*

Guangming et al, "The study of CsI-EuI2 binary system", [J] Acta Chim. Sinica, 1995 V53 (10): 947-951.*

Lisek et al, "High-temperature study of phase equilibria in the systems CsCl-LnCl3 (Ln=Ce,Nd) by Knudsen effusion mass spectrometry", Journal of Thermal Analysis and Calorimetry, vol. 55, (Feb. 1, 1999), pp. 627-637.*

Zhuraleva et al, "Crystal growth and scitillation propeties of Cs3CeX6 and CsCe2X7 (X=Cl,Br)", Nuclear Science Symposium Confrence Record (NSS/MIC) 2010 IEEE vol. No. pp. 1296-1299, Oct. 20, 2010-Nov. 6, 2010.*

Rooh et al, The growth and characterization of the cerium contained inorganic halide scintillators, Database compendex [online] Engineering Information, XP-002666180, Database accession No. E20103313143, 8249, abstract, Key Engineering Materials, vol. 442, pp. 275-282, 2010.*

Cherepy, et al, "Strontium and barium iodide high light yield scintillators", Applied Physics Letters, vol. 92, (2008), (3 pages).

Kramer, et al, "Development and Characterization of Highly Efficient New Cerium Doped Rare Earth Halide Scintillator Materials", J. Mater. Chem., 2006, 16, pp. 2773-2780.

Ma, et al, "Thermodynamic calculation of the GdCl3-ACl (A=Na,K,Rb,Cs) phase diagrams based on experimental data", Calphad, vol. 30, Issue 1, Mar. 2006, pp. 88-94.

Schilling, et al., "Ternary Bromide and Iodides of Divalent Lanthanides and Thier Alkaline-Earth Analoga of the Type AMX3 and Am2X5," Z. anorg. allg. Chem. 622 (1996), pp. 759-765.

Grimm et al., "Upconversion Between 4f-5d Excited States in Tm2+-Doped CsCaCl3, CsCaBr3, and CsCaI3," Chem. Eur. J. (2007), 13, Wiley-VCH Verlag GmbH & Co., Weinheim, DE, pp. 1152-1157.

Zhuravleva, Mariya et al., "Crystal Growth and Scintillation Properties of Cs3CeCl6 and CsCe2Cl7," J. Crystal Growth (2010), Elsevier, 4 pages.

Higgins, et al, "Bridgman growth of LaBr3:Ce and LaCl3:Ce crystals for high-resolution gamma-ray spectrometers", J. Crystal Growth 287 (2006) pp. 239-242.

Seifert, H.J., "Ternary chlorides of the trivalent early lanthanides: Phase diagrams, crystal structures and thermodynamic properties", J. Thermal Analysis and Calorimetry 67 (2002), pp. 789-826.

Kapala, et al, "Modelling of the thermodynamic properties of the ABr-CeBr3 (A=Li-Cs ) systems", Calphad, vol. 34, Issue 1, Mar. 2010, pp. 15-19.

Rycerz, et al, "Phase diagram and electrical conductivity of the CeBr3—CsBr binary system", J. Therm. Anal. Calorim. 97 (2009), pp. 1015-1021.

Xinhua, et al, "Fluorescence Spectra of ARE2I5 and AREI3 in the Solid State (A [identical to] K, Rb, Cs, Ti; RE [identical to] Sm, Eu)", Journal of Alloys and Compounds, vol. 180, Issues 1-2, Mar. 25, 1992, pp. 235-238.

Baopeng, et al., "Synthesis and structure of AEuI3 (A[triple bond; length as m-dash]Rb, Cs) and AEu2I5 (A[triple bond; length as m-dash]K, Rb, Cs)", Journal of Alloys and Compounds, vol. 181, Issues 1-2, Proceedings of the 19th Rare Earth Research Conference, Apr. 3, 1992, pp. 511-514.

Bourret-Courchesne, et al., "Eu2+-doped Ba2CsI5, a New High-performance Scintillator," Nuclear Instruments and Methods in Physics Research A 612 (2009), Elsevier, pp. 138-142.

Gundiah, et al., "Scintillation Properties of Eu2+-activated Barium Fluoroiodide," 2009 IEEE Nuclear Science Symposium Conference Record, pp. 1575-1578.

Bourret-Courchesne, et al., "BaBrI:Eu2+, a New Bright Scintillator," Nuclear Instruments and Methods in Physical Research A 613 (2010), Elsevier, pp. 95-97.

Dorenbos, "Thermal Quenching of Eu2+ 5d-4f Luminescence in Organic Compounds," J. Phys.: Condes. Matter 17 (2005), pp. 8103-8111.

Glodo et al., "Spectroscopy of Selected Alkaline Earth Halides," IEEE (2010), pp. 271-274.

Selling et al., "Europium-doped Barium Halide Scintillators for X-ray and Gamma-ray Detections," Journal of Applied Physics 101, 034901 (2007), pp. 1-5.

Bao, Xinhua et al., "Phase diagram of the CsBr-CaBr2 System", Rare Metals, vol. 25, No. 3, Jun. 2006, pp. 293-296 (replaces Chemical abstract 2006:757179).

* cited by examiner

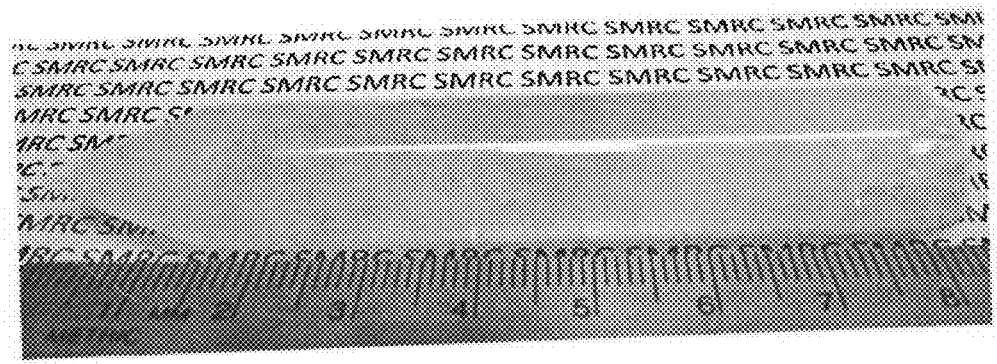
FIG. 8A  KCaI$_3$: Eu 3%
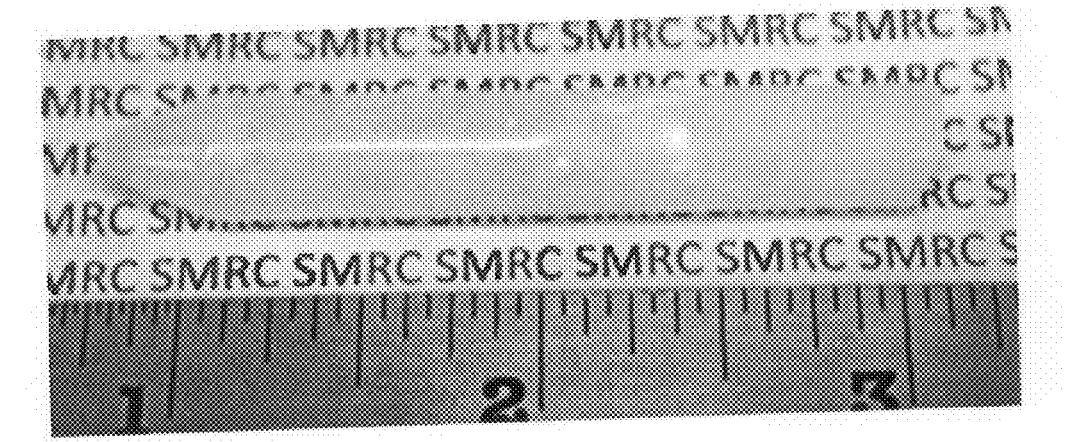
FIG. 8B  CsCaI$_3$: Eu 3%

CsSrCl₃

Prior Art

CsSrBr₃

Prior Art

CsSrCl₃: Eu 10%

CsSrBr₃: Eu 10%

CsCaCl₃: Eu 10%

CHLORIDE, BROMIDE AND IODIDE SCINTILLATORS WITH EUROPIUM DOPING

CROSS-REFERENCE TO RELATED APPLICATIONS

The present application claims the benefit of U. S. Provisional Application Ser. No. 61,443,076 filed Feb. 15, 2011 and of U. S. Provisional Application Ser. No. 61/491,074 filed May 27, 2011, and is a continuation-in-part of U. S. patent application Ser. No. 13/098,654, filed May 2, 2011 (now U. S. Pat. No. 8,692,203 issued Apr. 8, 2014) which claims the benefit of U. S. provisional patent application Ser. No. 61/332.945, filed May 10, 2010, all of Zhuravleva el al., all priority applications being incorporated by reference in their entirety.

STATEMENT OF GOVERNMENT SUPPORT

The invention was made with government support under Contract No. DHS-DNDO 2009-DN-077-AR103I-03 awarded by the Department of Homeland Security and under DOE—NA22: DE-NA0000473 awarded by the U.S. Department of Energy. The government has certain rights in the invention.

TECHNICAL FIELD

The present invention generally relates to new chloride, bromide and iodide scintillator crystals with divalent Europium doping, and, more particularly, to halide scintillators represented by one of the following formulae: $ACa_{1-y}Eu_yX_3$ (where A=K, Rb or Cs, or a combination thereof, and $0 \leq y \leq 1$) and $CsA_{1-y}Eu_yX_3$ (where A=Ca, Sr, Ba, or a combination thereof, and $0 \leq y \leq 1$) and X=Cl, Br or I or a combination thereof in either formulae.

BACKGROUND

A halide scintillator for radiation detection is described in U.S. Published Patent Application No. 2011/0272585 and a chloride scintillator for radiation detection is described in U.S. Published Application No. 2011/0272586 published Nov. 10, 2011, both published applications of Zhuravleva et al. of the University of Tennessee. The halide scintillator is single-crystalline and has a composition of the formula $A_3MBr_{6(1-x)}Cl_{6x}$ or $AM_2Br_{7(1-x)}Cl_{7x}$ wherein A consists of one of Li, Na, K, Rb, Cs or any combination thereof, and M consists of Ce, Sc, Y, La, Lu, Gd, Pr, Tb, Yb, Nd or any combination thereof and $0 \leq x \leq 1$. The chloride scintillator is also single crystalline and has a composition of the formula $AM_2Cl_7$ and A and M consist of the elements indicated above. A modified Bridgman technique was used to form the crystals. A Bridgman method is described in Robertson J. M., 1986, Crystal Growth of Ceramics: Bridgman-Stockbarger method in Bever: 1986 "Encyclopedia of Materials Science and Engineering," Pergamon, Oxford pp. 963-964" among other known tutorials incorporated by reference herein as to any material deemed essential to an understanding of the Bridgman method.

An iodide scintillator for radiation detection is described in EP 2387040 published Nov. 16, 2011 and claims priority to U.S. patent application Ser. No. 13/098,654 filed May 2, 2011 and to U.S. provisional patent application Ser. No. 61/332,945 filed May 10, 2010, also of Zhuravleva et al. of the University of Tennessee. The disclosed iodide scintillators have a composition of the formula $AM_{1-x}EuI_3$, $A_3M_{1-x}Eu_xI_5$ and $AM_{2(1-x)}Eu_{2x}I_5$, wherein A consists essentially of an alkali element (such as Li, Na, K, Rb, Cs) or any combination thereof, M consists essentially of Sr, Ca, Ba or any combination thereof, and $0 \leq x \leq 1$. These iodide scintillator crystals were made by first synthesizing a compound of the above composition and then forming a single crystal from the synthesized compound, for example, by the Vertical Gradient Freeze method. In particular, high-purity starting iodides (such as CsI, $SrI_2$, $EuI_2$ and rare-earth iodide(s)) are handled in a glove box with, for example, pure nitrogen atmosphere and then mixed and melted to synthesize a compound of the desired composition of the scintillator material. A single crystal of the scintillator material is then grown from the synthesized compound by the Bridgman method or Vertical Gradient Freeze (VGF) method, in which a sealed ampoule containing the synthesized compound is transported from a hot zone to a cold zone through a controlled temperature gradient at high speed to form the single-crystalline scintillator from molten synthesized compound. The ampoule may be sealed with a hydrogen torch after creating a vacuum on the order of $1 \times 10^{-6}$ millibars. The scintillator crystal may be cut and polished using sand papers and mineral oil and then optically coupled to a photon detector, such as a photomultiplier tube (PMT), arranged to receive the photons generated by the scintillator and adapted to generate a signal indicative of the photon generation. Typically, plates about 1-3 mm in thickness may be cut from the boules and small samples selected for the optical characterization. This scintillator crystal work has been continuing at the University of Tennessee, Scintillation Materials Research Center, Knoxville, Tenn.

Also, pursuant to U.S. Published Patent Application No. 2011/0165422, published Jul. 7, 2011, complimentary development of a lanthanide doped strontium barium mixed halide scintillator crystal, for example, $Sr_{0.2}Ba_{0.75}Eu_{0.05}BrI$ has been developed with 5% Eu doping, also using a Bridgman growth technique, at the University of California.

Pursuant to U.S. Published Patent Application No. 2011/0024635 published Feb. 3, 2011, of Shah et al., a lithium containing halide scintillator composition is disclosed. This CsLiLn composition appears to have been produced at Radiation Monitoring Devices, Inc. of Watertown, Mass.

The need for radiation detecting materials has been at the forefront of materials research in recent years due to applications in national security, medical imaging, X-ray detection, gamma-ray detection, oil well logging (geological applications) and high energy physics among other applications. Typically, a crystal of the types described above desirably exhibit high light yields, fast luminescence decay (for example, below 1000 ns), good stopping power, high density, good energy resolution, ease of growth, proportionality and stability under ambient conditions. $La_xBr_3:Ce_{1-x}$ (E. V. D. van Loef et al., Applied Physics Letters, 2007, 79, 1573) and $Sr_xI_2:Eu_{1-x}$ (N. Cherepy et al., Applied Physics Letters, 2007, 92, 083508) are present day benchmark materials that satisfy some of the desired criteria, but their application is limited due to the extreme hygroscopic nature. Other known benchmarks that are commercially available include bismuth germanate (BGO) and NaI:Tl available from a number of sources.

There remains a need in the art for further research and development of scintillator crystal materials for the applications described above.

SUMMARY OF THE DISCLOSURE

This summary is provided to introduce a selection of concepts. These concepts are further described below in the Detailed Description. This summary is not intended to identify key features or essential features of the claimed subject matter, nor is this summary intended as an aid in determining the scope of the claimed subject matter.

The present invention meets the above-identified needs by providing inorganic scintillator crystals such as halide scintillators with divalent Europium doping represented by one of the following formulae: $ACa_{1-y}Eu_yX_3$ (where A=K, Rb or Cs, or a combination thereof and X=Cl, Br or I or a combination thereof and $0 \leq y \leq 1$) and $CsA_{1-y}Eu_yX_3$ (where A=Ca, Sr, Ba, or a combination thereof and X=Cl, Br or I or a combination thereof and $0 \leq y \leq 1$). Generally, an embodiment comprises $ABX_3$ where A is an alkali, B is an alkali earth and X is a halide.

In one embodiment, an inorganic single crystal scintillator comprises the formula: $ACa_{1-y}Eu_yX_3$ (where A=K, Rb or Cs, or a combination thereof and X=Cl, Br or I or a combination thereof and $0 \leq y \leq 1$). In particular, crystals were formed for $KCaI_3$:Eu from studying a known $KI$—$CaI_2$ phase diagram system whereby a Potassium Iodide (KI) and Calcium Iodide ($CaI_2$) graph plotted from a mole concentration of 0% KI to 100% $CaI_2$ versus temperature between, for example, 200 and 800° C.; (phase diagrams are available from the National Institute of Standards and Technology (NIST) phase diagrams database). Also, crystals were formed for $RbCaI_3$, for $CsCaI_3$ and for $CsCaCl_3$ following known phase diagrams and by utilizing as pure and anhydrous raw materials as possible. Anhydrous RbI not being generally available, techniques were employed to purify the RbI raw material using known techniques. These crystals were grown using one of a vertical gradient freeze or a modified Bridgman method. A Czochralski technique or combination Bridgman/Czochralski method may be used as an alternative process for growing scintillator crystals.

In another embodiment, an inorganic single crystal scintillator comprises the formula: $CsA_{1-y}Eu_yX_3$ (where A=Ca, Sr, Ba, or a combination thereof, and $0 \leq y \leq 1$) and X=Cl, Br or I or a combination thereof. Similar growth techniques were employed and their characteristics studied as scintillators.

Further features and advantages of the present invention, as well as the structure and operation of various aspects of the present invention, are described in detail below with reference to the accompanying drawings.

BRIEF DESCRIPTION OF THE DRAWINGS

The features and advantages of the present invention will become more apparent from the detailed description set forth below when taken in conjunction with the drawings in which like reference numbers indicate identical or functionally similar elements.

FIGS. 1, 2 and 9 comprise PRIOR ART phase diagrams obtained via the National Institute of Standards and Technology (NIST) phase diagram database and are reproduced here for purposes of enablement of one of ordinary skill in the art.

FIG. 1 is a PRIOR ART phase diagram of a $KI$—$CaI_2$ system whereby KI is shown at left and $CaI_2$ is shown at right between 0 and 100% mol concentration while temperature is depicted along the left vertical axis between 200° C. and 800° C. The diagram shows formation of a congruently melting compound $KCaI_3$ and points to the fact that crystals of $KCaI_3$ can be grown from the melt.

FIG. 2 is a PRIOR ART phase diagram of $KCaI_3$ as well as similar systems for RbI to $CaI_2$ and CsI to $CaI_2$ also between 200° C. and 800° C. All three compounds, $KCaI_3$, $CsCaI_3$ and $RbCaI_3$ are congruently melting compounds and, therefore, their crystals can be grown from the melt.

FIG. 8A to 8C provides black and white line drawings made from photographs of the $KCaI_3$:Eu 3%, $CsCaI_3$:Eu 3% and $RbCaCl_3$:Eu 3% crystals respectively compared with measurement rulers (except $RbCaCl_3$:Eu 3%).

FIG. 13A represents $CsCaCl_3$:Eu 10%; FIG. 13B represents $CsSrCl_3$:Eu 10% and FIG. 13C represents $CsSrBr_3$:Eu 10%. Scintillation time profiles were recorded using a $^{137}Cs$ gamma-ray source. Scintillation decay constants obtained from fitting the curves with exponential functions are shown in legends.

FIG. 14A represents $CsCaCl_3$:Eu 10%; FIG. 14B represents $CsSrCl_3$:Eu 10% and FIG. 14C represents $CsSrBr_3$:Eu 10% normalized to a benchmark bismuth germanate (BGO) standard sample with its photopeak at channel 100.

FIG. 15A represents $CsSrBr_3$:Eu 10% and FIG. 15B is a similar graph for $CsCaCl_3$:Eu 10%.

DETAILED DESCRIPTION

The present invention is generally directed to new inorganic scintillator crystals from the concept $ABX_3$ where A is an alkali, B is an alkali earth and X is a halide comprising one of chlorine, bromine and iodine. Also, levels of divalent Europium doping were investigated between 1% and 10% with exemplary scintillator crystals grown and their characteristics recorded. It is also directed to combination inorganic crystal scintillators where Cesium, Strontium, Calcium and Barium are used in combination, for example, to form scintillator crystals of the formula $CsSrX_3$:Eu 1 to 10% or $CsCaX_3$:Eu 1 to 10% or $CsSrBaX_3$:Eu 1 to 10% with divalent Europium doping for substitution with one of the other divalent elements (Sr, Ca and SrBa combination). First, the formation of $ACaI_3$ crystals with divalent Europium doping will be discussed as one example followed by a discussion of the combination crystals.

EXAMPLE 1

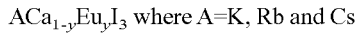

$ACa_{1-y}Eu_yI_3$ where A=K, Rb and Cs

Figure 1:
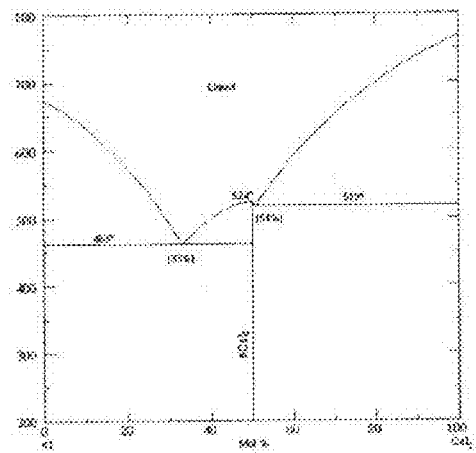

Referring to FIG. 1, there is shown a PRIOR ART exemplary system potassium iodide and calcium iodide showing a mol concentration versus temperature plot. Halide salts generally rapidly absorb moisture and preferably are maintained dry so as not to pre-assume a crystalline form with water. As will be explained herein, the purification process and handling of these halide salts is best performed under protective atmosphere to obtain pure, anhydrous salts, for example, using a zone refining technique in furnaces, melt-filtering or other known techniques where the material may be sealed in a quartz ampoule either under vacuum or nitrogen or argon gas.

Figure 2:
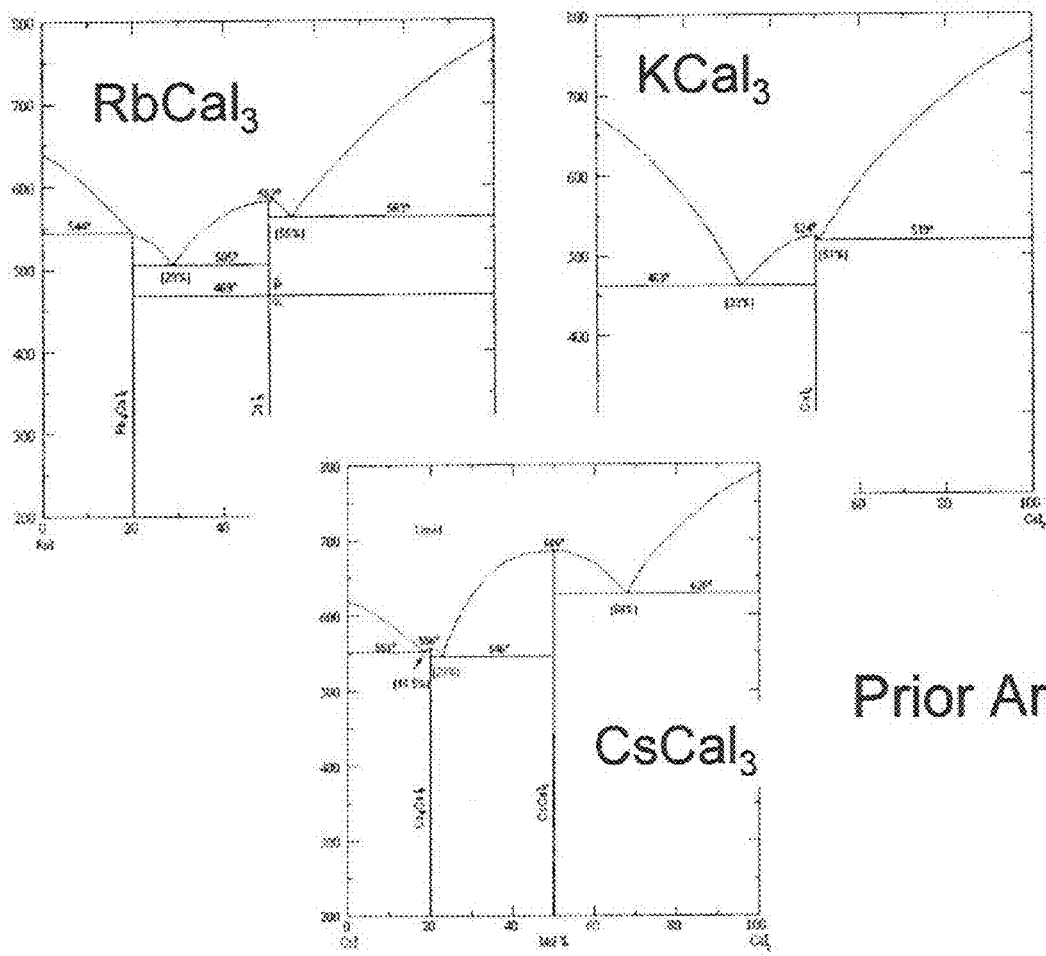

FIG. 2 shows similar plots for rubidium and cesium, respectively, and calcium chloride. RbI is presently not available in pure, anhydrous form and must be purified and rendered as anhydrous as possible using known techniques. First referring to FIG. 1, $KCaI_3$ is a congruently melting compound with a melting point at 524° C.

The PRIOR ART table 1 below provides the details for each crystal formed for each of potassium, rubidium and cesium and $Z_{eff}$ calculated using a known formula:

TABLE 1

|  | $KCaI_3$ | $RbCaI_3$ | $CsCaI_3$ |
|---|---|---|---|
| $T_m$, ° C. | 524 | 582 | 686 |
| Crystal Structure | Ortho-rhombic | Ortho-rhombic | Ortho-rhombic |
| Phase transition, ° C. | No | 470 | No |
| Density, g/cm³ | 3.81 | NA | 4.06 |
| $Z_{eff}$ | 50.6 | 50.0 | 52.6 |

From the table 1 summary above, all three crystals exhibit an ortho-rhombic crystal structure. Accurate black and white line drawings of the respective crystals with Eu 3% are depicted in FIG. 8. The melting temperature varies from 524° C. for potassium to 686° C. for Cesium. There is no phase transition exhibited for either potassium or cesium. A phase transition at 469° C. or approximately 470° C. was noted for rubidium. The $Z_{eff}$ did not vary much, from 50.0 to 52.6. The density in grams per cubic centimeter was between 3.8 and 4.1 approximately.

Figure 3:
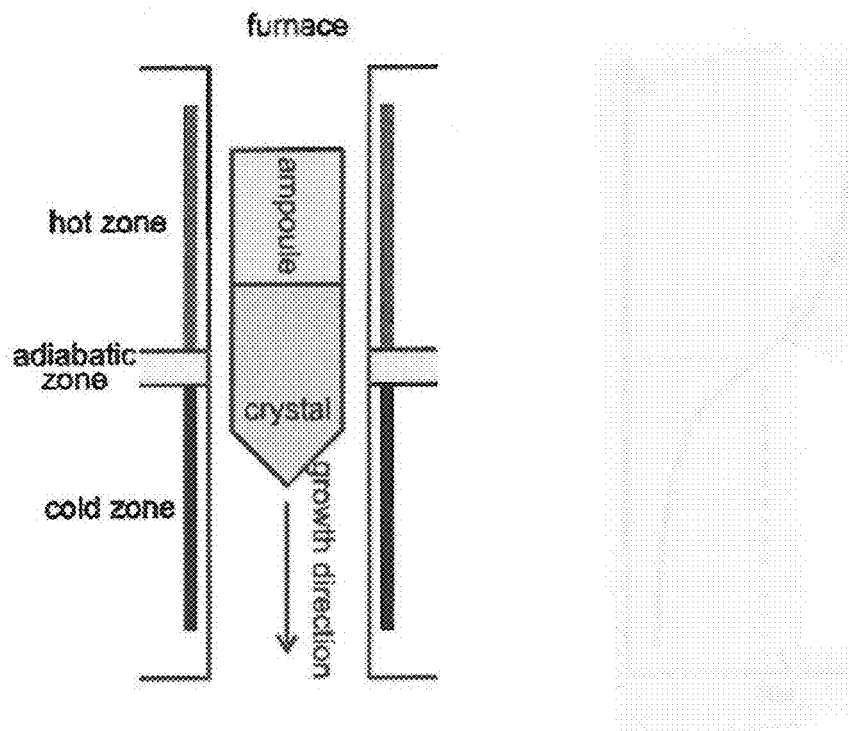
FIG. 3 shows typical Bridgman apparatus in diagrammatic form comprising from top to bottom, a hot zone, an adiabatic zone and a cold zone whereby the center of the furnace shows crystal growth direction from an ampoule in the hot zone.

The vertical gradient freeze and a modified Bridgman technique depicted in FIG. 3 may be used to form the crystals whose characteristics are described in table 1. The method may also be used with or as a substitute for a vertical gradient freeze (VGF) method. A Czochralski technique or combined Czochralski/Bridgman technique may be used in the alternative to grow scintillator crystals. As explained above, halide salts are moisture sensitive. One step in the process is to synthesize the compound using high purity anhydrous starting halides such as CsI, KI, RbI, $EuI_2$ and $CaI_2$. In the case of RbI, the salt was dried and purified in a glove box using known techniques. It is recommended that the dry salt raw materials be handled in a glove box prior to movement to the ampoule of FIG. 3. A typical ampoule is a vacuum-sealed quartz ampoule at $10^{-6}$ vacuum pressure. A Mellen Electro-Dynamic Gradient (EDG) furnace with a translation motor may be utilized to generate heat. Synthesized material may be further purified via filtering through a frit followed by several runs of zone refining. Growth parameters are suggested as follows: a temperature gradient may be between 25-75° C. per inch of crystal growth; a translation rate may be one millimeter per hour (range of 0.5 to 2 mm per hour); a typical cool down rate may be 5° C. per hour. Crystal growth results are shown in FIG. 8 against rulers showing length of growth.

In addition to growth in single crystalline form, the scintillator compounds discussed herein may be prepared as polycrystalline powders by mixing fine grain powder components in stoichiometric ratios and sintering at a temperature somewhat below the melting point. Furthermore, these compositions may be synthesized in polycrystalline ceramic form by hot isostatic pressing of fine grained powders.

Figure 4:
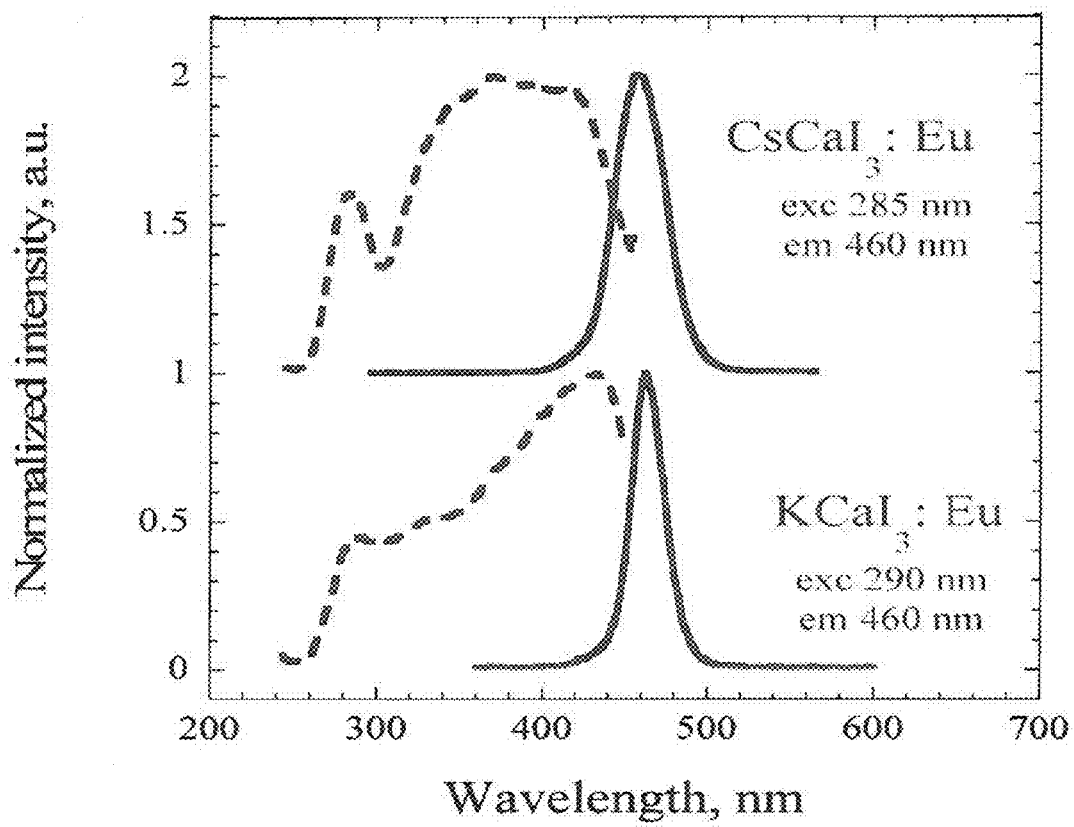
FIG. 4 provides a graph for photoluminescence emission and excitation spectra for $CsCaI_3$:Eu and $KCaI_3$:Eu wherein dashed lines represent wide excitation bands and solid lines represent emission bands for each crystal.

Referring now to FIG. 4, there is shown a graph for $CsCaI_3$ and $KCaI_3$ with excitation at 285, 290 nm wavelength (in dashed line) and emission at 460 nm wavelength for each crystal (in solid line) shown as the respective peaks. Intensity levels are shown in the vertical axis as normalized intensity. A Flourolog3 lifetime spectrofluorometer (horiba Jobin Yvon) was used in the measurements. Emissions and excitation bands are characteristic of $Eu^{2+}$ 5d to 4f luminescence. The $Ca^{2+}$ ion provides a substitution site for $Eu^{2+}$ doping. The characteristic data confirms incorporation of $Eu^{2+}$ into the lattice of each crystal scintillator in the stable divalent state as a substitute for calcium. Moreover, $Eu^{2+}$ doping is confirmed to demonstrate excellent luminosity and high spectral energy resolution at normal room temperatures.

Figure 5:
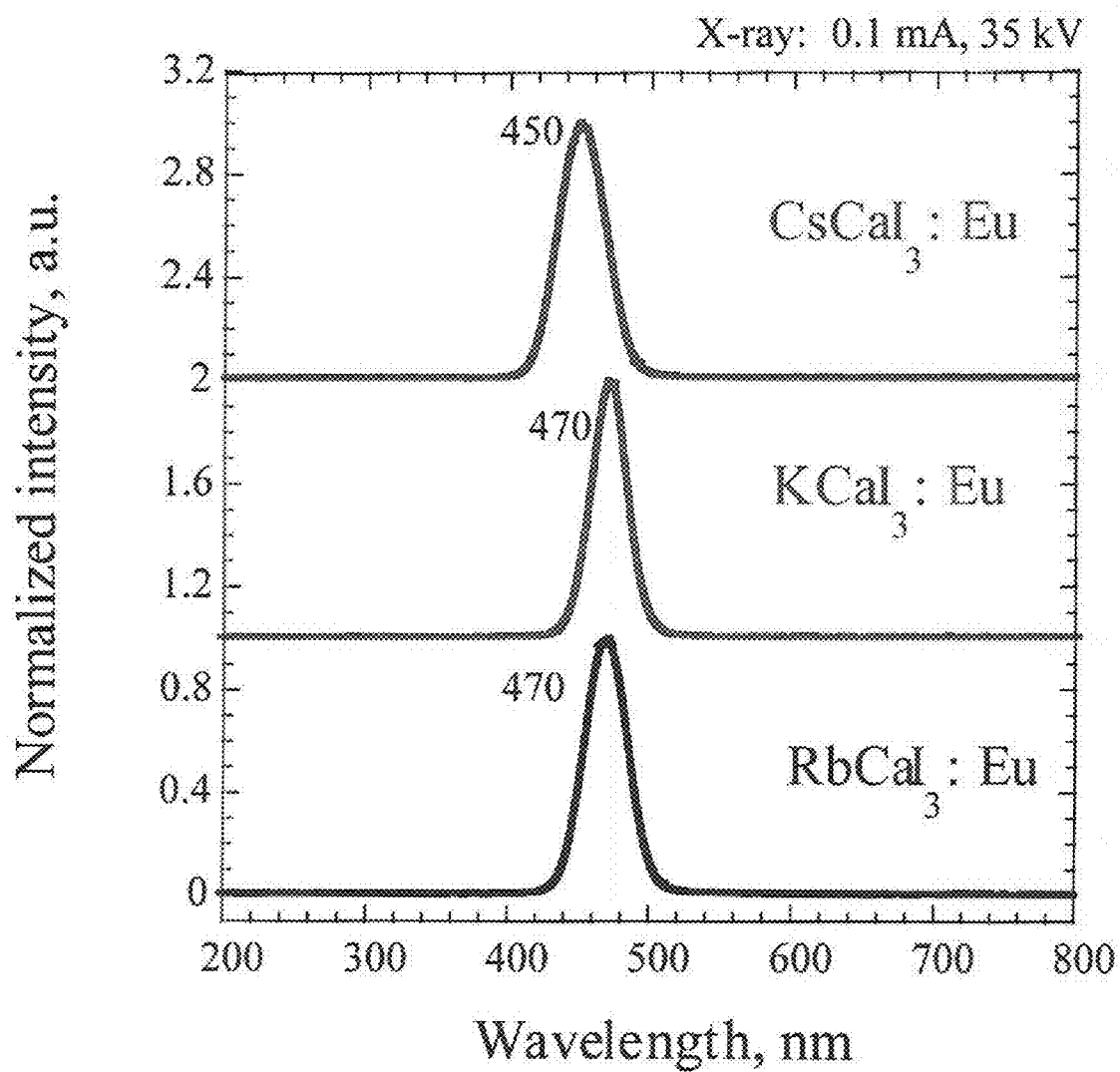
FIG. 5 provides graphs for radio-luminescence for each crystal: $CsCaI_3$:Eu, $KCaI_3$:Eu, and $RbCaI_3$:Eu, demonstrating $Eu^{2+}$ 5d-4f luminescence under X-ray excitation.

Referring to FIG. 5, there are shown graphs for X-Ray radioluminescence spectra for each crystal: $CsCaI_3$:Eu, $KCaI_3$:Eu, and $RbCaI_3$:Eu where the emission peak maxima are at 450, 470 and 470 nm respectively and normalized intensity shown as the vertical axis as before. Radioluminescence spectra were measured at room temperature under continuous irradiation from an X-ray generator (35 kV and 0.1 mA). Again, the emission bands are characteristic of $Eu^{2+}$ 5d-4f luminescence. The emission is suitable for use with conventional photodetectors known in the art such as photomultiplier tubes (PMT's), for example, a Photonis XP2020Q PMT and fast timing electronics.

Figure 6:
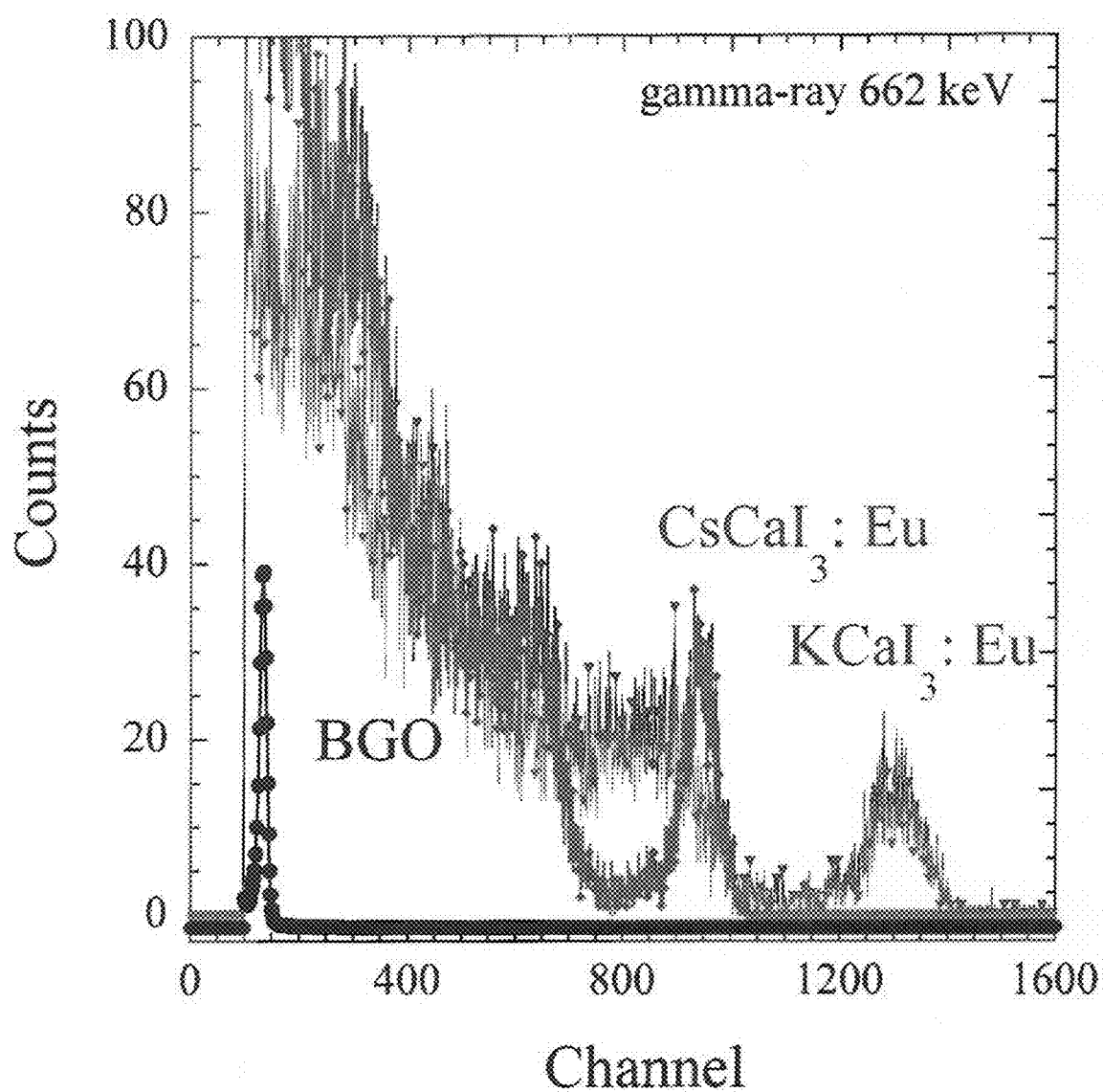
FIG. 6 provides $^{137}Cs$ energy spectra with 662 keV gamma-ray photopeaks for $CsCaI_3$:Eu 3% (the upper curve) and $KCaI_3$:Eu 3% (the lower curve) normalized to a benchmark bismuth germanate (BGO) standard sample with its photopeak at channel 100.

Referring now to FIG. 6, there is shown $^{137}$Cs gamma-ray energy spectra for the CsCaI$_3$:Eu 3% and KCaI$_3$:Eu 3% crystals. Light output measurements were carried out on samples covered in mineral oil and directly coupled to a photomultiplier tube (PMT) and covered with Teflon tape. A Hamamatsu H3177-50 PMT may be used for the absolute light measurements. Gamma-ray energy spectra were recorded using a $^{137}$Cs source with a 6 μsec shaping time. Both the CsCaI$_3$:Eu 3% (generally upper, side-wise square) and KCaI$_3$:Eu 3% (generally lower, triangle pointing down) scintillator crystal spectra exhibit the position of a 662 keV gamma-ray photopeak at a much higher channel number than a benchmark bismuth germanate (BGO) crystal with its photopeak at channel 100, indicating much higher light output. While different Eu doping was used between 1 and 10 mol %, an optimal Eu$^{2+}$ activator concentration was found to be 3 mol %.

The photo peaks in FIG. 6 were fitted with Gaussian functions to determine the centroid of the peak and the energy resolution. The integral quantum efficiency of the PMT according to the emission spectrum of the scintillators was used to estimate the light output in photons per unit gamma ray energy. All photon (light) output, temperature measurements, energy resolutions, wavelengths, durations, densities and the like in the tables are to be considered approximate measurements. Table 2 below shows the absolute light output and energy resolution for the particular samples used for the measurements compared to a NaI:Tl reference sample. The energy resolution at 662 keV was determined from the full width at half maximum (FWHM) of the 662 keV photopeak.

TABLE 2

| Composition | Light yield, photons/MeV (approximate) | Energy resolution, %@662 keV (approximate) |
|---|---|---|
| KCaI$_3$:Eu 3% | 60,000 | 5 |
| CsCaI$_3$:Eu 3% | 38,500 | 7 |
| RbCaI$_3$:Eu 3% | No gamma-ray photo peak | NA |
| NaI:Tl | 38,000 | ~7 |

As can be seen from the table 2, the RbCaI$_3$:Eu 3% sample did not provide a resolved gamma-ray photo peak. On the other hand, the KCaI$_3$:Eu 3% crystal greatly exceeded the benchmark NaI:Tl crystal at a light yield of approximately 60,000 photons per Me V compared with approximately 38,000 for NaI:Tl while the CsCaI$_3$:Eu 3% crystal matched, if not, exceeded the NaI:Tl light yield. As for energy resolution, both the KCaI$_3$:Eu 3% and CsCaI$_3$:Eu 3% crystals exhibited a very acceptable range between 5% (for KCaI$_3$:Eu) and 7% for CsCaI$_3$:Eu at 662 keV.

Figure 7A:
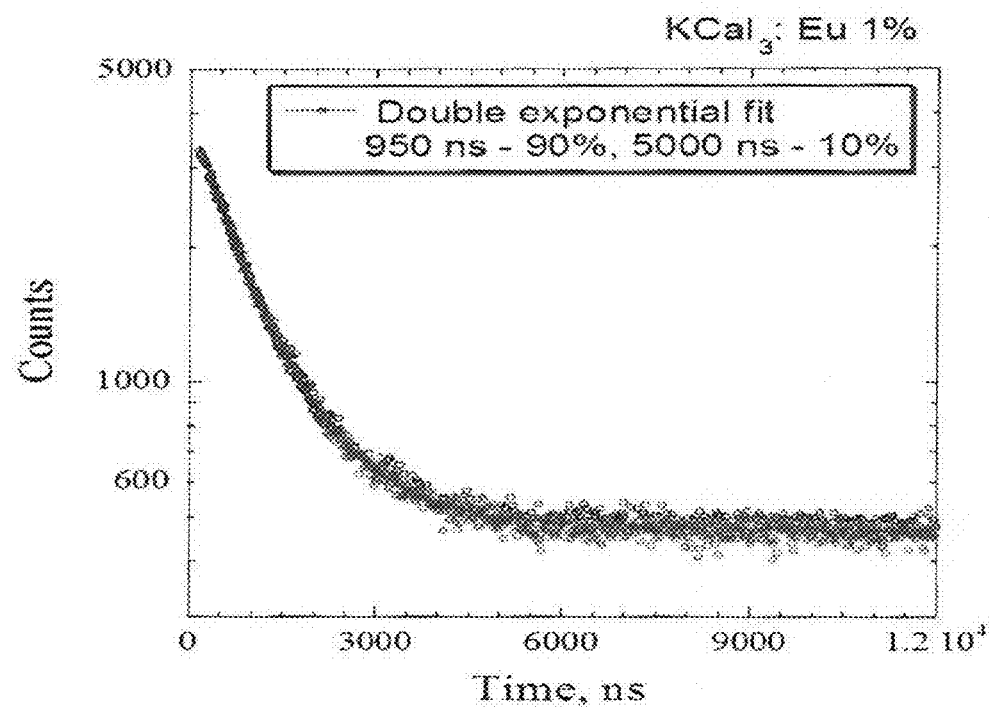
FIG. 7A to 7C provides graphs of scintillation decay for each crystal $KCaI_3$:Eu 1%, $RbCaI_3$:Eu 1% and $CsCaI_3$:Eu 1% in counts over time measured in nanoseconds. Scintillation time profiles were recorded using a $^{137}Cs$ gamma-ray source. Scintillation decay constants obtained from fitting the curves with exponential functions are shown in legends.
Figure 7B:
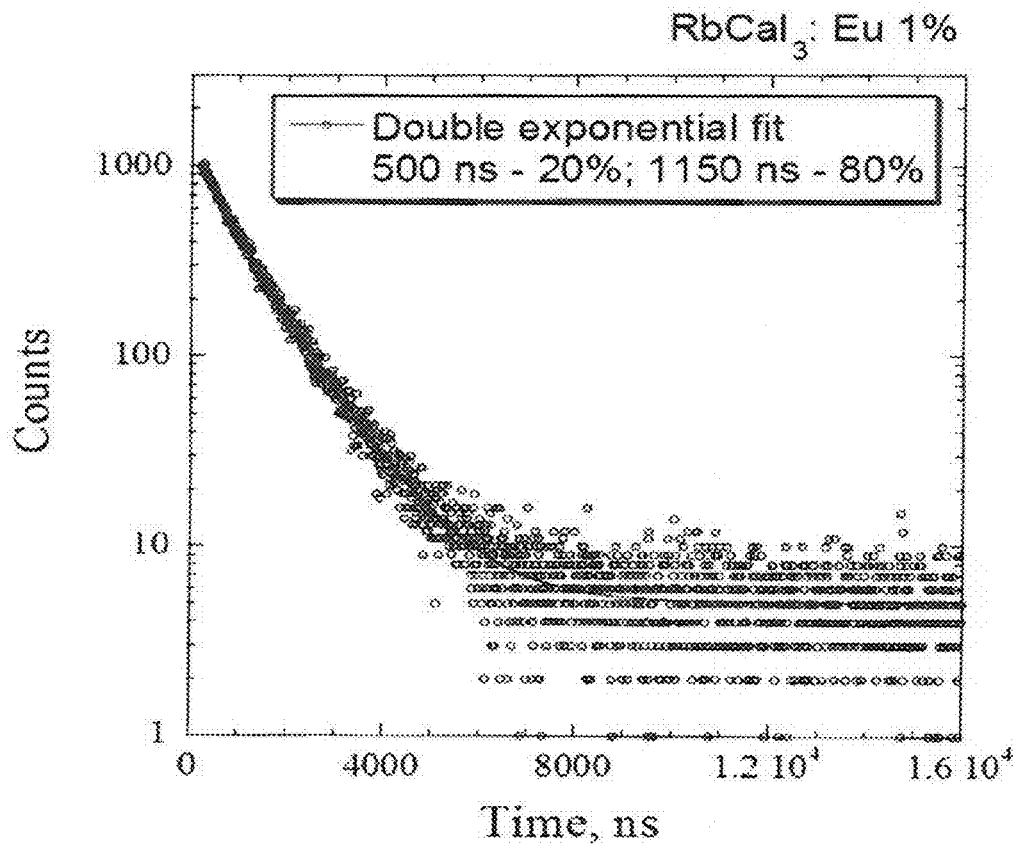
Figure 7C:
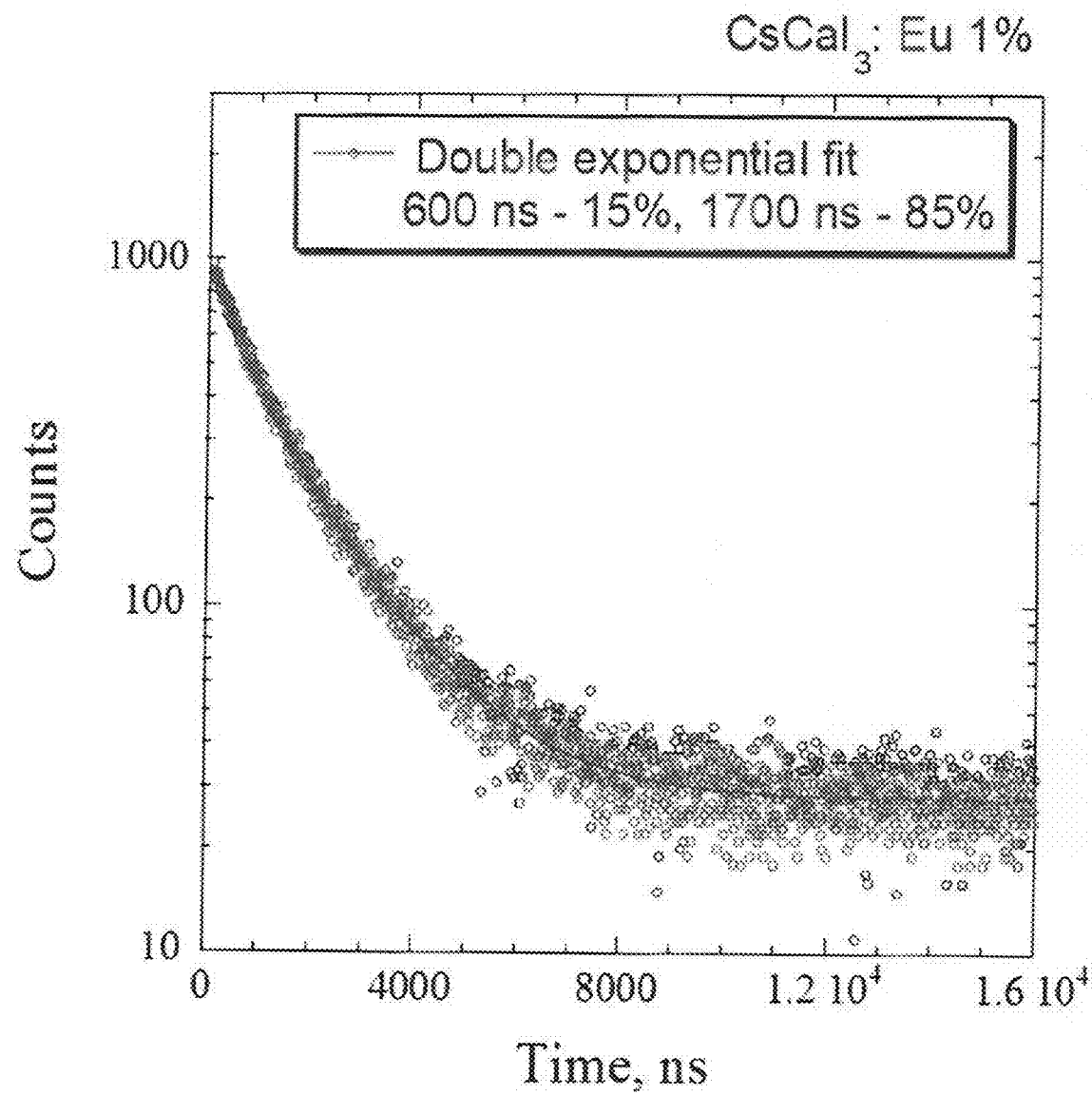

Scintillation decay is shown in FIGS. 7A through 7C for each crystal: where FIG. 7A represents KCaI$_3$:Eu 1%; FIG. 7B represents RbCaI$_3$:Eu 1% and FIG. 7C represents CsCaI$_3$: Eu 1% scintillation decay results in counts over time. Scintillation decay was measured using a time-correlated single photon counting technique and using a $^{137}$Cs 662 keV gamma-ray source. Scintillation decay constants obtained from fitting the curves with exponential functions are shown in legends. A primary decay around one μsecond is characteristic of Eu$^{2+}$ 5d to 4f luminescence.

Figure 8C:
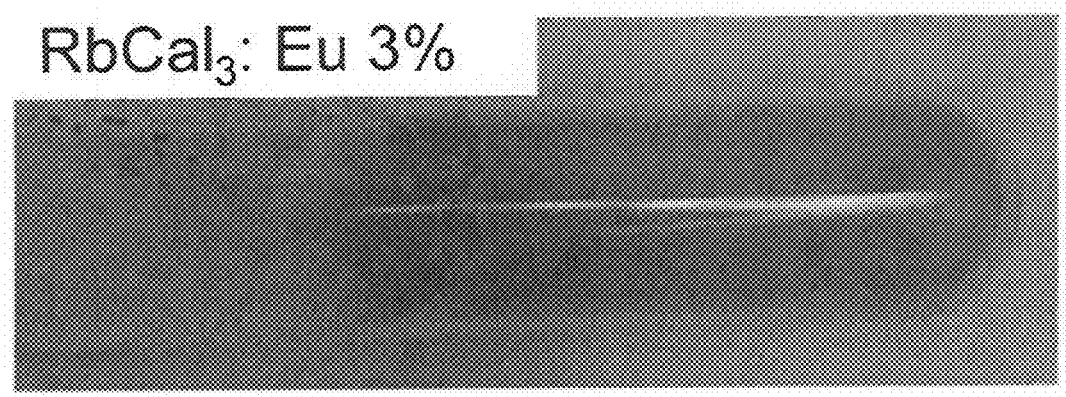

Referring now to FIG. 8A, there are shown black and white line drawings prepared from photographs of a KCaI$_3$:Eu 3% crystal compared with a metric ruler. The lengthwise ruler indicates that the potassium crystal was grown to a length of over six centimeters and measured approximately 0.5 centimeters in width. Referring now to FIG. 8B, there are shown black and white line drawings prepared from photographs of a CsCaI$_3$:Eu 3% crystal compared with a ruler. The lengthwise ruler in inches indicates that the potassium crystal was grown to a length of over two inches and measured approximately 0.5 centimeters in width. Referring now to FIG. 8C, there is shown a black and white line drawing prepared from a photograph of a RbCaI$_3$:Eu 3% crystal.

The following table 3 provides a summary of results for CsCaI$_3$:Eu 3% and KCaI$_3$:Eu 3% crystals compared with those of a benchmark NaI:Tl crystal:

TABLE 3

| Composition | $T_m$, °C. (approx) | Crystal structure | Density g/cm$^3$ (approx) | $Z_{eff}$ | Max RL, nm | Primary sc, decay μs | LO, photons per Mev (approx) | Hygroscopic? |
|---|---|---|---|---|---|---|---|---|
| CsCaI$_3$:Eu 3% | 686 | orthorhombic | 4.06 | 52.6 | 450 | 1.7 | 38,500 | yes |
| KCaI$_3$.Eu 3% | 524 | orthorhombic | 3.81 | 50.6 | 470 | .95 | 60,000 | yes |
| NaI:Tl | 651 | cubic | 3.67 | 51 | 415 | .23 | 38,000 | yes |

In summary for this example, it is demonstrated that practical crystal growth comparable to NaI:Tl may be obtained at reasonable cost (involving congruent melting and acceptable melting point). Since the crystals are hygroscopic, hermetic packaging may be used with conventional photodetectors such as photo-multiplier tubes such as a Photonis XP2020Q PMT and fast timing electronics. X-ray, gamma-ray, and optical excitation have been demonstrated. With improved crystal quality (removal of raw material impurity and improved processing), both light output and energy resolution are expected to improve beyond their current levels.

EXAMPLE 2

CsA$_{1-y}$Eu$_y$X$_3$ (where A=Ca, Sr, Ba, or a Combination thereof and X=Cl, Br or I or a Combination thereof) with Divalent Europium Doping where $0 \leq y \leq 1$ Now, single crystal inorganic crystal scintillators will be described of the formula CsAX$_3$ will be described with divalent Europium doping investigated as above between 1 and 10 mol % where A is calcium (Ca), strontium (Sr) or barium (Ba) or a combination thereof and X is a halide selected from chlorine, bromine or iodine. In particular, it will be shown that a crystal of CsSrCl$_3$:Eu 10% exhibits a light yield on the order of 46,000 photons per MeV and a scintillation decay at 2.6 μseconds and provides excellent gamma-ray and X-ray detection characteristics. The A$^{2+}$ lattice site provides a substitutional site for the Eu$^{2+}$ doping.

Figure 9A:
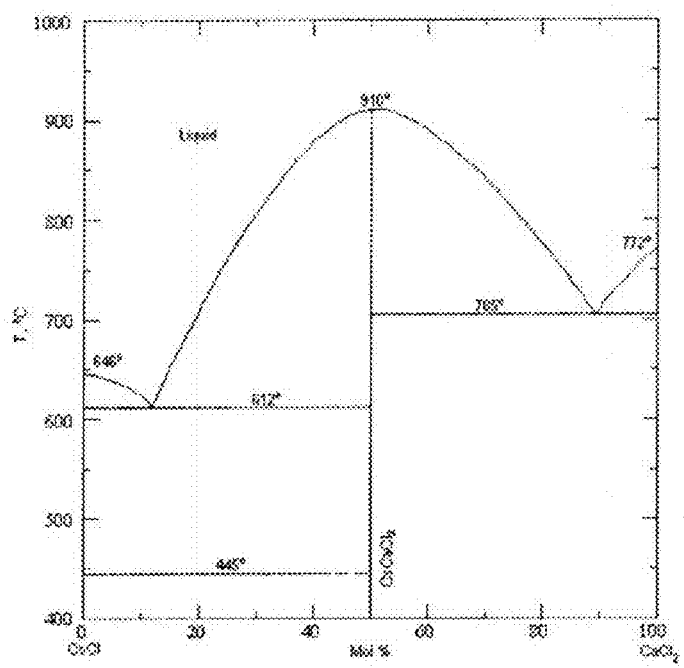
FIG. 9A is a PRIOR ART phase diagram of the CsCl—$CaCl_2$ system whereby CsCl is shown at left and $CaCl_2$ is shown at right between 0 and 100% mol concentration while temperature is depicted along the left vertical axis between 200° C. and 800° C.
Figure 9B:
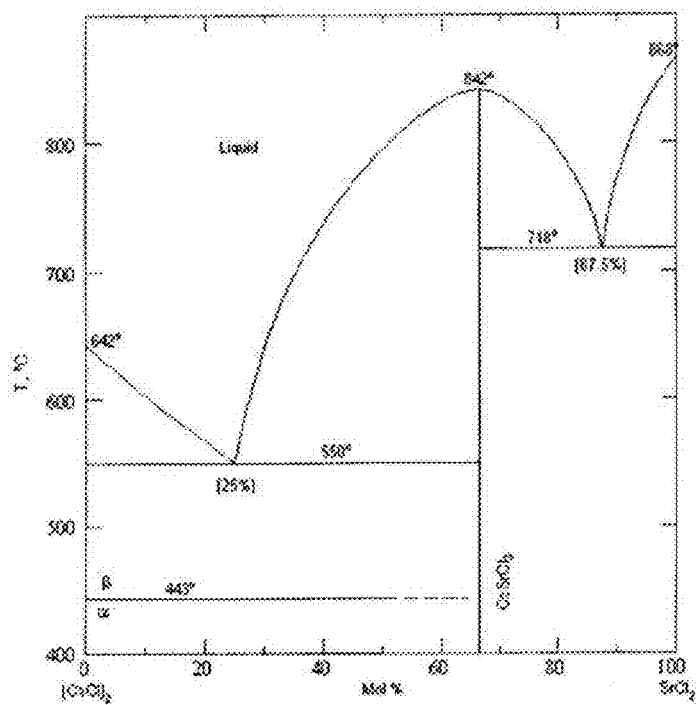
FIG. 9B is a PRIOR ART phase diagram of the CsCl—$SrCl_2$ system whereby CsCl is shown at left and $SrCl_2$ is shown at right between 0 and 100% mol concentration while temperature is depicted along the left vertical axis between 200° C. and 800° C.
Figure 9C:
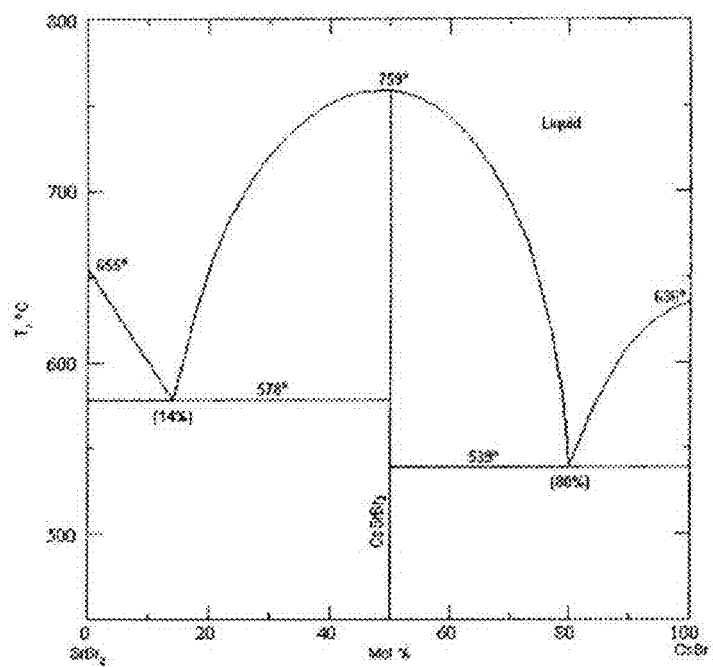
FIG. 9C is a PRIOR ART phase diagram of the $SrBr_2$—CsBr system whereby $SrBr_2$ is shown at left and CsBr is shown at right between 0 and 100% mol concentration while temperature is depicted along the left vertical axis between 200° C. and 800° C. All three compounds, $CsCaI_3$, $CsSrI_3$ and $CsSrBr_3$ are congruently melting compounds and, therefore, their crystals can be grown from the melt.

Referring to FIGS. 9A to 9C, FIG. 9A shows a PRIOR ART phase diagram of the CsCl—CaCl$_2$ system whereby CsCl is shown at left and CaCl$_2$ is shown at right between 0 and 100% mol concentration while temperature is depicted along the left vertical axis between 200° C. and 800° C.; FIG. 9B is a similar PRIOR ART phase diagram of the CsCl—SrCl$_2$ system whereby CsCl is shown at left and SrCl$_2$ is shown at right; and FIG. 9C is a PRIOR ART phase diagram of the SrBr$_2$—CsBr system whereby SrBr$_2$ is shown at left and CsBr is shown at right between 0 and 100% mol concentration while temperature is depicted along the left vertical axis between 200° C. and 800° C. Divalent europium was used primarily for doping as follows: $r(Eu^{2+})=1.20$ A (CN=7); $r(Sr^{2+})=1.21$ A and $r(Ca^{2+})=1.06$ A. Perovskite type ABX$_3$ compounds were obtained by congruently melting and with practical crystal growth according to the methods discussed above and below.

Table 4, in part PRIOR ART, below provides a summary of the crystal growth for each scintillator crystal:

TABLE 4

|  | CsCaCl$_3$:Eu 10% | CsSrCl$_3$:Eu 10% | CsSrBr$_3$:Eu 10% |
|---|---|---|---|
| Crystal structure at room temperature | Cubic | Ortho-rhombic | Ortho-rhombic |
| Melting point, ° C. | 910 | 842 | 760 |
| Density, g/cm$^3$ | 3.0 | 3.06 | 3.76 |
| Phase transition, ° C. | 445 | 112, 443 | No |

A method of crystal growth has already been described above with respect to a discussion of FIG. 3. Bridgman crystal growth may comprise a gathering of anhydrous 99.99% pure raw materials. The materials may be further purified by vacuum drying and melt filtering. As described above, a quartz ampoule may be employed having hot and cold zones whereby crystals may be grown under vacuum seal. A Mellen Electro-Dynamic Gradient (EDG) furnace with a translation motor may be utilized to generate heat. The crystal growth parameters may be the same as described above: temperature gradient at 75° C./inch, translation rate at one millimeter per inch and a cool down rate of 5° C. per hour (exemplary). The scintillator crystals were grown with spontaneous orientation. The ternary halide scintillators may be synthesized using vertical gradient freeze (VGF), Bridgman and melt synthesis and other techniques as suggested above.

Figure 10:
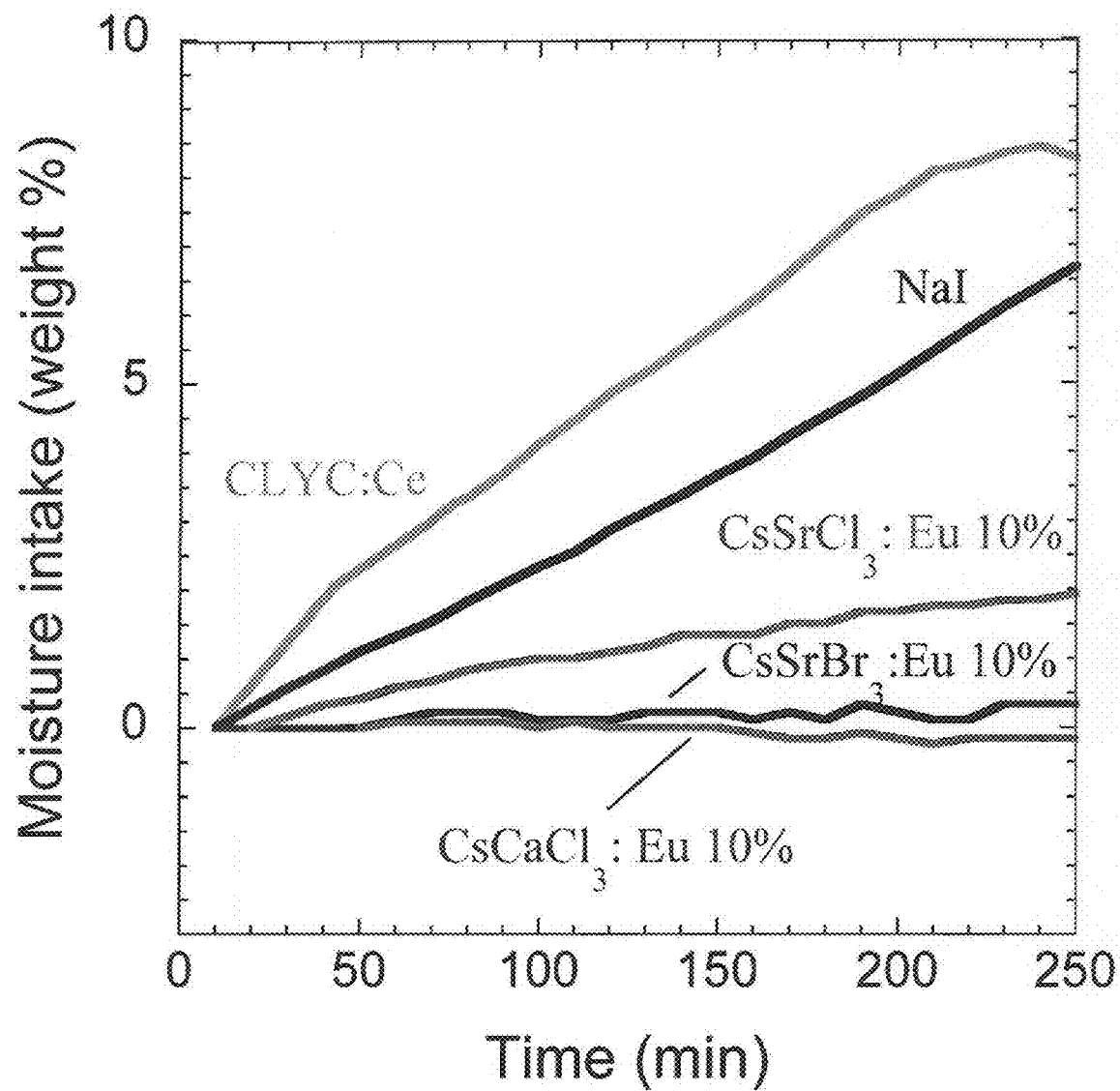
FIG. 10 is a graph over time of moisture intake of $Cs_2LiYCl_6$:Ce and NaI as benchmarks and the following crystals: $CsSrCl_3$:Eu 10%; $CsSrBr_3$:Eu 10% and $CsCaCl_3$:Eu 10% where the latter two crystals exhibit little or no moisture intake. Measurements were made at the same temperature and humidity conditions.

FIG. 10 is a graph over time of moisture intake of Cs$_2$LiYCl$_6$:Ce and NaI as benchmarks and the following crystals: CsSrCl$_3$:Eu 10%; CsSrBr$_3$:Eu 10% and CsCaCl$_3$:Eu 10% where the latter two crystals exhibit little or no moisture intake. CsSrBr$_3$:Eu 10% and CsCaCl$_3$:Eu 10% both exhibit practically flat moisture intake over a period of 250 minutes (over four hours). Moreover, CsSrCl$_3$ exhibits greatly improved moisture intake at 2% over four hours compared with NaI at over 6.5%. The samples were measured in a closed box with controlled environment at room temperature. All samples showed significantly lower moisture sensitivity compared to NaI and CLYC scintillators.

Figure 11:
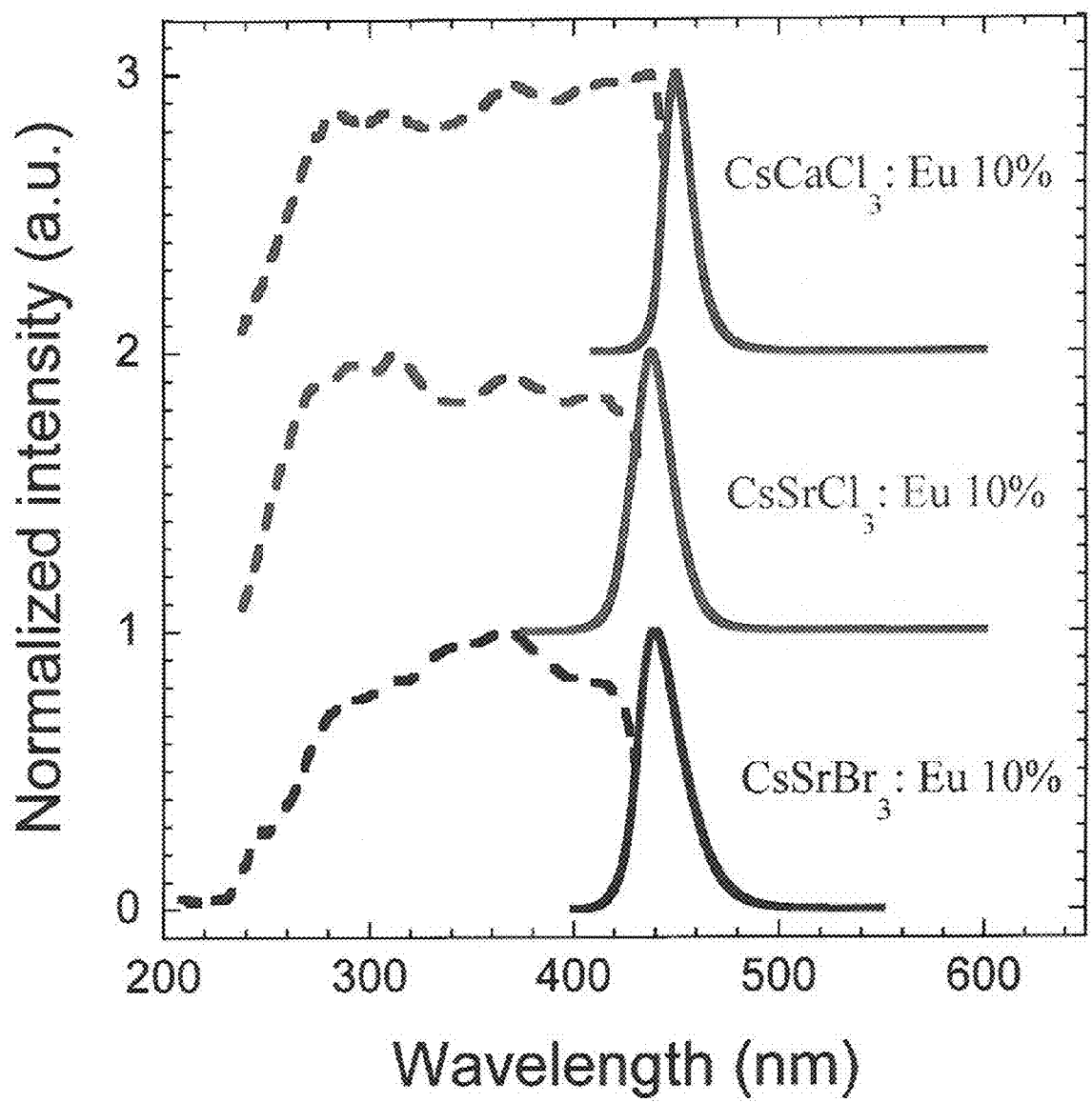
FIG. 11 is a photoluminescence emission and excitation spectra graph for each of the $CsCaCl_3$:Eu 10%, $CsSrCl_3$:Eu 10% and $CsSrBr_3$:Eu 10% crystals where dashed lines represent wide excitation bands and solid lines represent emission bands.

FIG. 11 represents photoluminescence spectra for each of the CsCaCl$_3$: 10%, CsSrCl$_3$:Eu 10% and CsSrBr$_3$:Eu 10% scintillator crystals where dashed lines represent wide excitation bands and solid lines represent emission bands. The emission and excitation bands are characteristic of Eu$^{2+}$ 5d to 4f luminescence. Incorporation of Eu$^{2+}$ is thus confirmed into the lattice structures in the stable divalent state of the crystals. Photoluminescence excitation and emission spectra may be measured with a Horiba Fluorolog 3 spectrofluorometer utilizing a Xe lamp excitation source and scanning monochromators. The following table 5 provides a summary of excitation (EXC) bands and emission (EM) bands:

TABLE 5

| Composition | EXC, nanometers wavelength | EM, nanometers wavelength |
|---|---|---|
| CsCaCl$_3$:Eu 10% | 278 to 440 nm | 450 nm |
| CsSrCl$_3$:Eu 10% | 270 to 430 nm | 439 nm |
| CsSrBr$_3$:Eu 10% | 270 to 430 nm | 440 nm |

Figure 12:
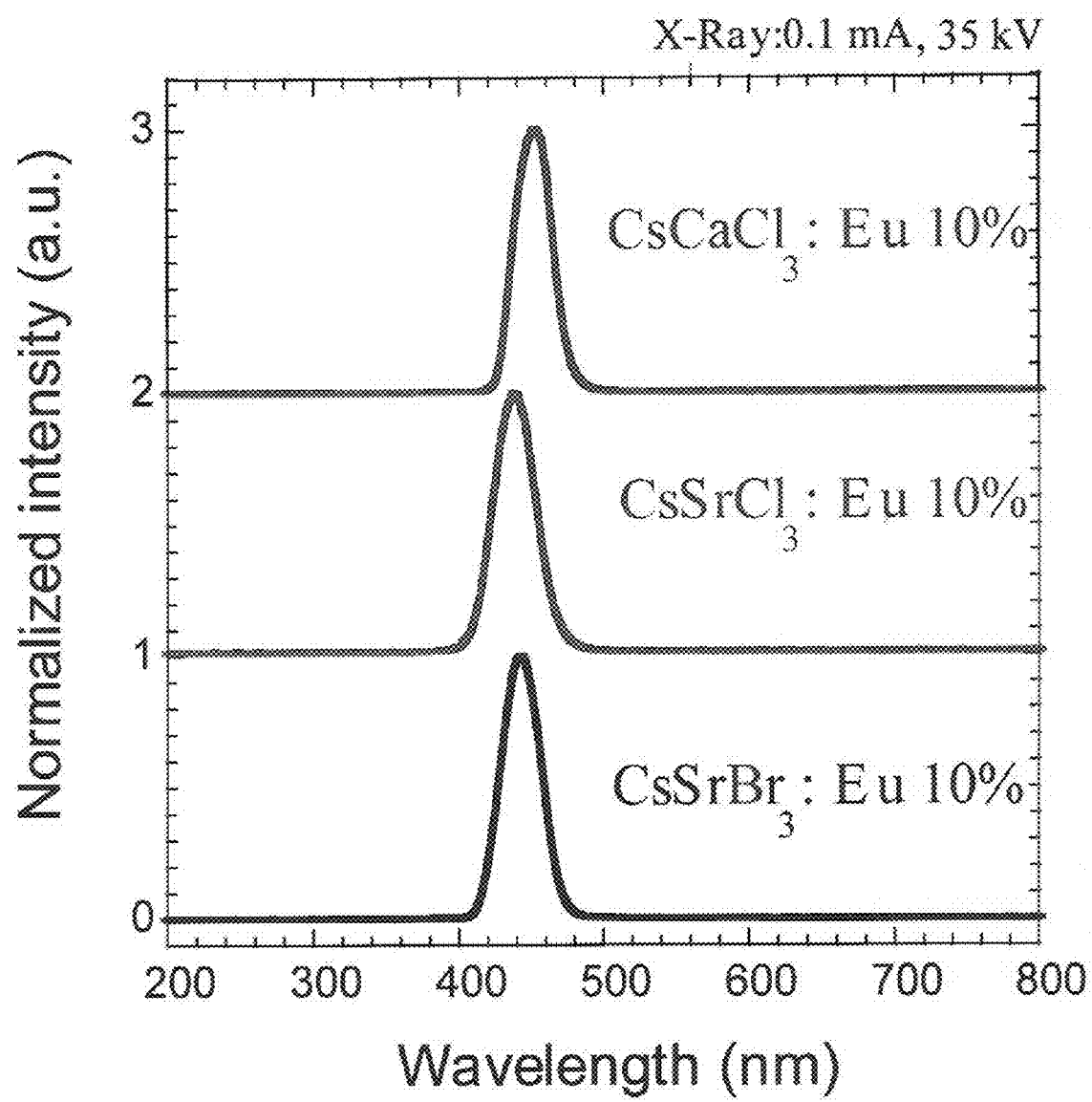
FIG. 12 provides graphs for radioluminescence for each crystal: $CsCaCl_3$:Eu 10%, $CsSrCl_3$:Eu 10% and $CsSrBr_3$:Eu 10% demonstrating $Eu^{2+}$ 5d-4f luminescence under X-ray excitation.

FIG. 12 is a graph of normalized intensity versus wavelength in nanometers of X-ray excitation of the CsCaCl$_3$: 10%, CsSrCl$_3$:Eu 10% and CsSrBr$_3$:Eu 10% scintillator crystals. Radioluminescence spectra were measured at room temperature under continuous irradiation from an X-ray generator (1 mA, 35 kV). An Acton monochromator may be used to resolve the spectrum as a function of wavelength. The graph demonstrates successful results of efficient radioluminescence under X-ray excitation. The emission bands are characteristic of Eu$^{2+}$ 5d-4f luminescence. The emission bands were at a wavelength suitable for capture using conventional photo detectors such as photo multiplier tubes (PMT's) such as a Photonis XP2020Q PMT and fast timing electronics. The measured emission peaks are as follows: for CsCaCl$_3$:Eu 10%, the peak was at 450 nm; for CsSrCl$_3$:Eu 10%, the peak was at 437 nm; and for CsSrBr$_3$:Eu 10%, the peak was at 443 nm.

Figure 13A:
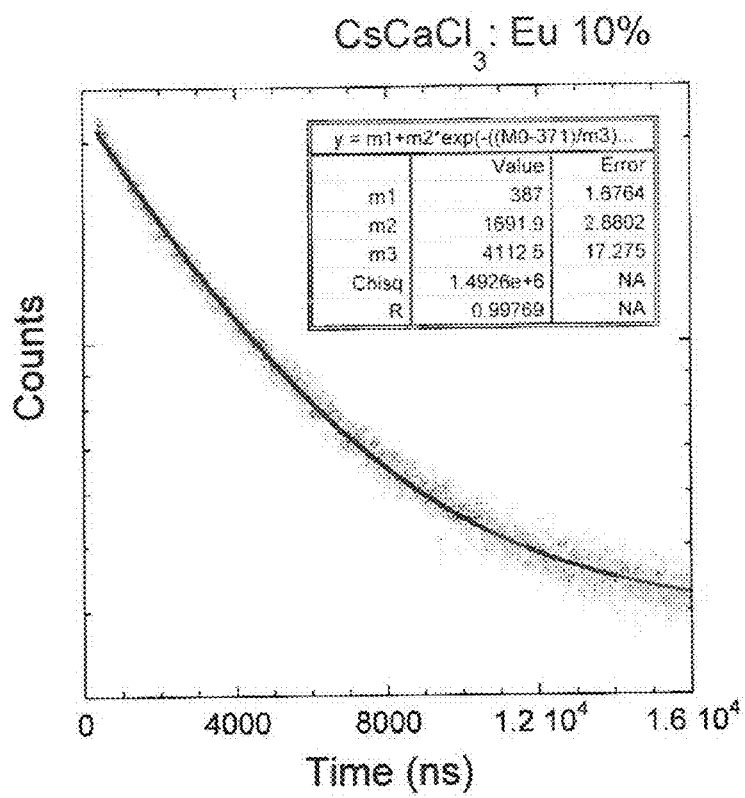
FIG. 13A to 13C represent graphs of scintillation decay over time for each crystal whereby
Figure 13B:
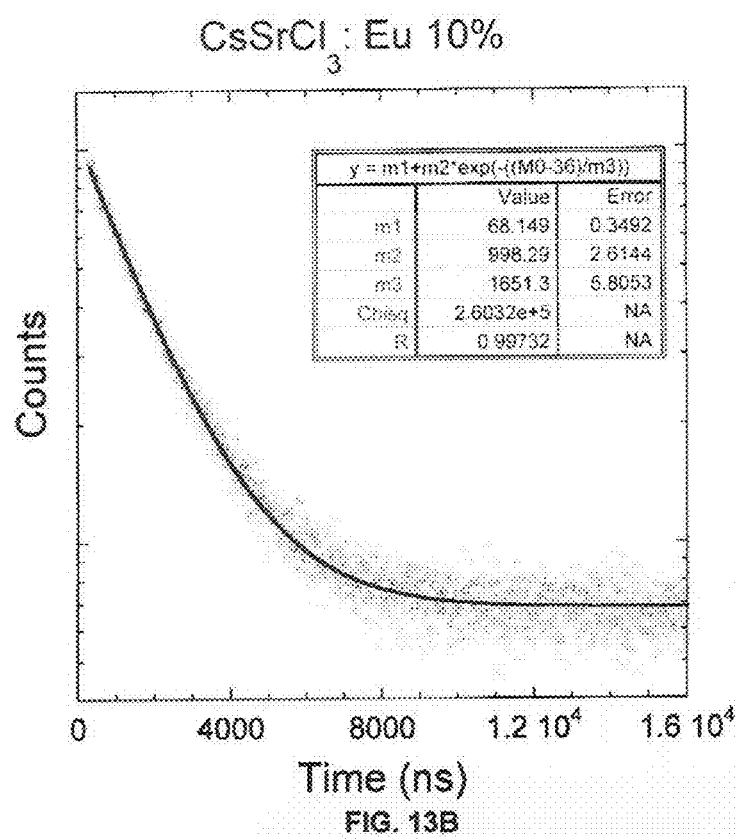
Figure 13C:
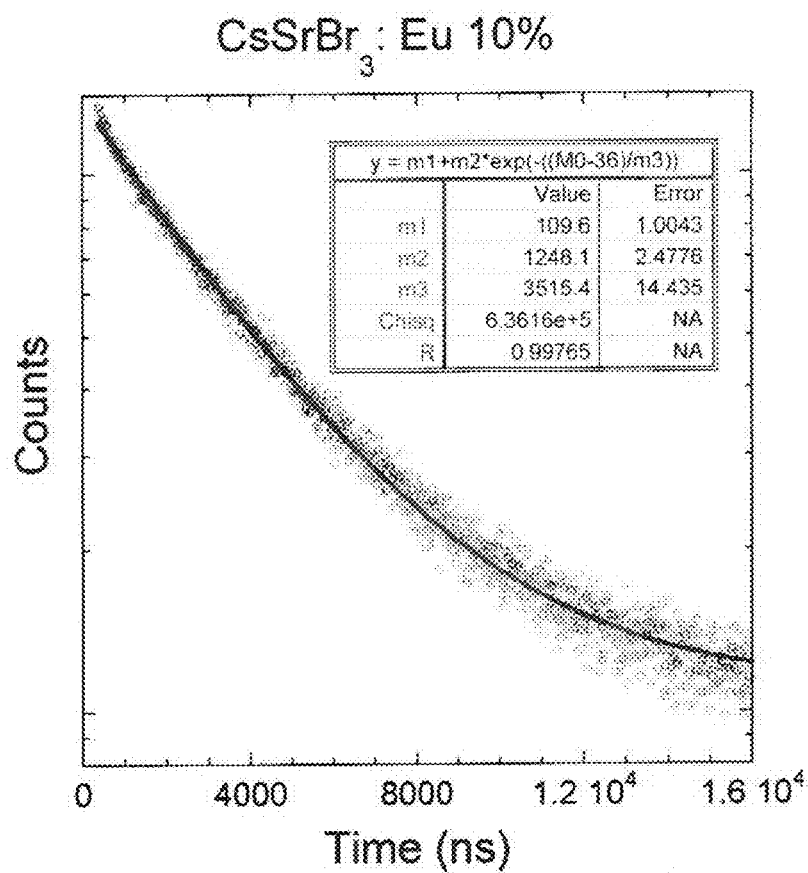

FIG. 13A to 13C represent graphs of scintillation decay over time for each crystal whereby FIG. 13A represents CsCaCl$_3$:Eu 10%; FIG. 13B represents CsSrCl$_3$:Eu 10% and FIG. 13C represents CsSrBr$_3$:Eu 10%. Scintillation time profiles were recorded using a $^{137}$Cs 662 keV gamma-ray source. Scintillation decay constants obtained from fitting the curves with exponential functions are shown in legends. The primary decay around 2-4 μseconds is characteristic of Eu$^{2+}$ 5d to 4f luminescence. The measured scintillation decay times were measured as follows: for CsCaCl$_3$:Eu 10%, the decay time was at 4.1 μseconds; for CsSrCl$_3$:Eu 10%, the decay time was at 2.6 μseconds (the fastest); and for CsSrBr$_3$:Eu 10%, the decay time was at 3.5 μseconds.

Figure 14A:
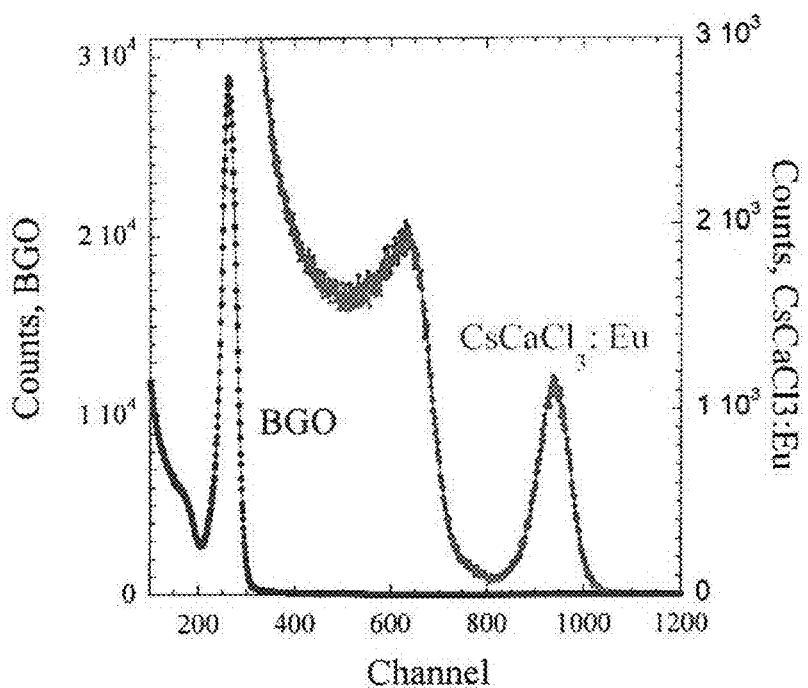
FIG. 14A to 14C represent graphs of $^{137}Cs$ energy spectra with 662 keV gamma-ray photopeaks for each crystal whereby
Figure 14B:
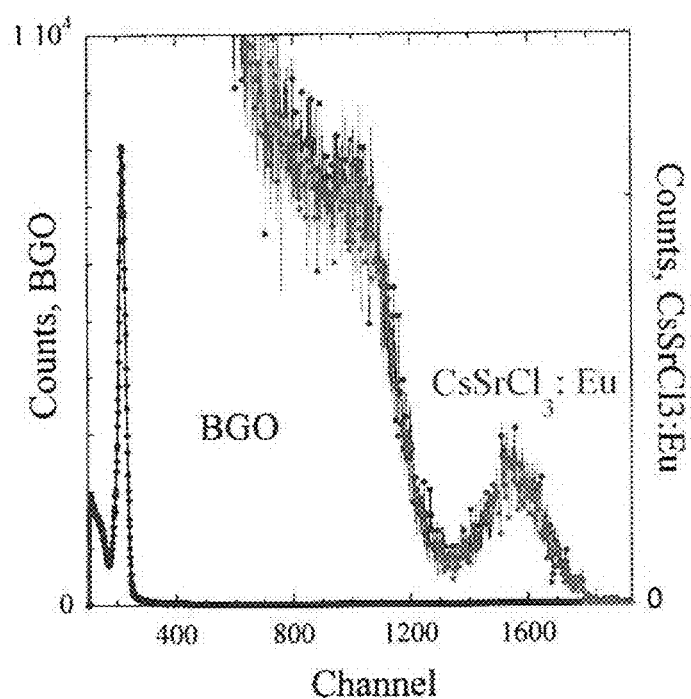
Figure 14C:
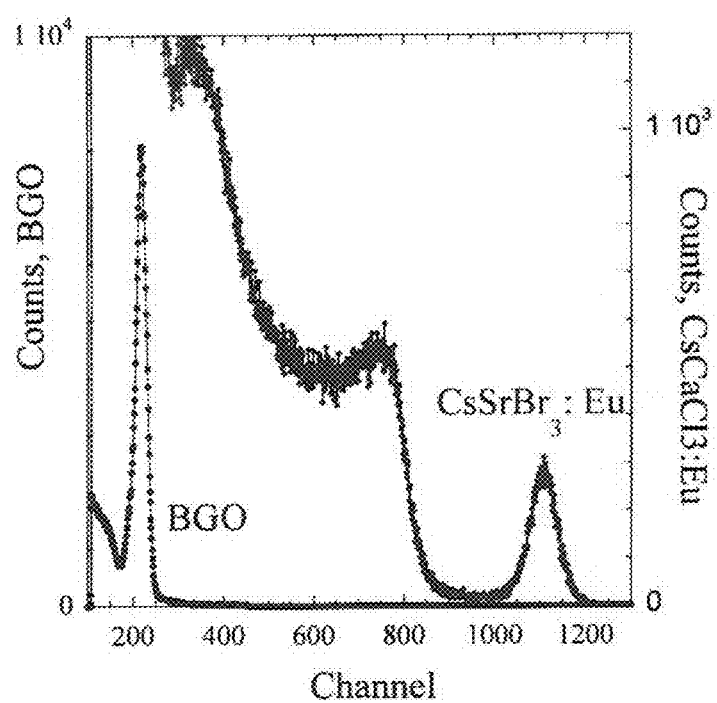

FIG. 14A to 14C represent graphs of $_{137}$Cs gamma-ray emission spectra for each crystal whereby FIG. 14A represents CsCaCl$_3$:Eu 10%; FIG. 14B represents CsSrCl$_3$:Eu and FIG. 14C represents CsSrBr$_3$:Eu normalized to benchmark bismuth germanate (BGO) with its photopeak at channel 100. Efficient scintillation characteristics were exhibited under excitation by ionizing radiation with respect to all three crystals. The following table 6 provides light yield and energy resolution for each crystal compared with NaI:Tl as a benchmark:

TABLE 6

|  | CsCaCl$_3$:Eu 10% | CsSrCl$_3$:Eu 10% | CsSrBr$_3$:Eu 10% | NaI:Tl |
|---|---|---|---|---|
| Light yield, ph/MeV (approx) | 18000 | 46000 | 31000 | 38000 |
| Energy resol. @ 662 keV, % (approx) | 8.9 | >10 | 6.7 | 7.1 |

As can be seen by the results, CsSrCl$_3$:Eu 10% demonstrates improved light yield over known NaI:Tl.

Figure 15A:
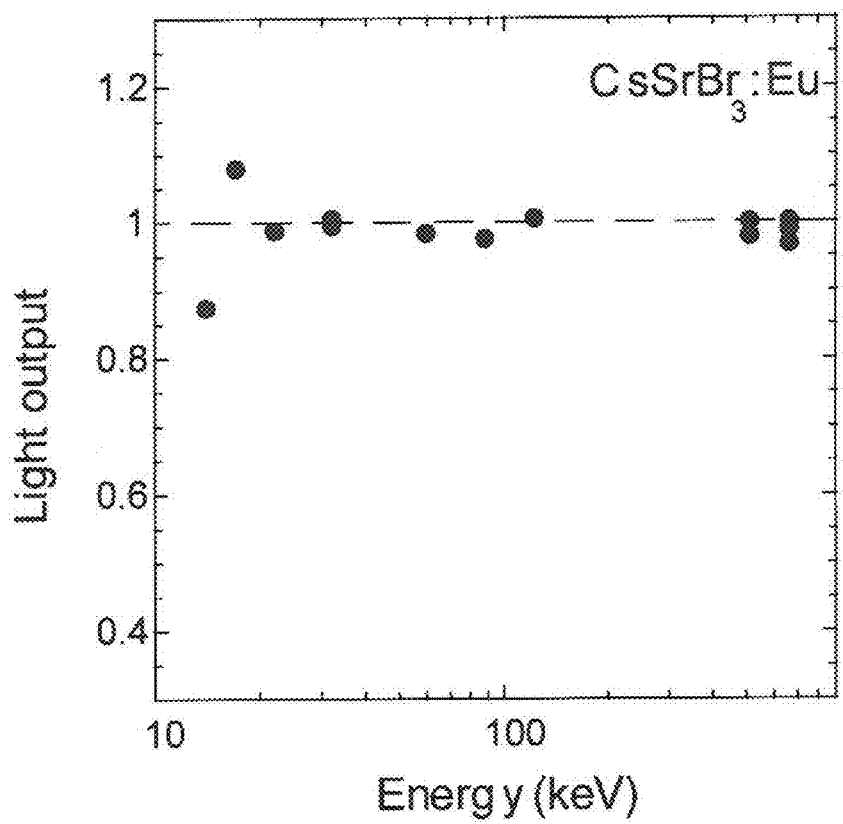
FIG. 15A to 15B are graphs demonstrating relative light output proportionality versus energy whereby
Figure 15B:
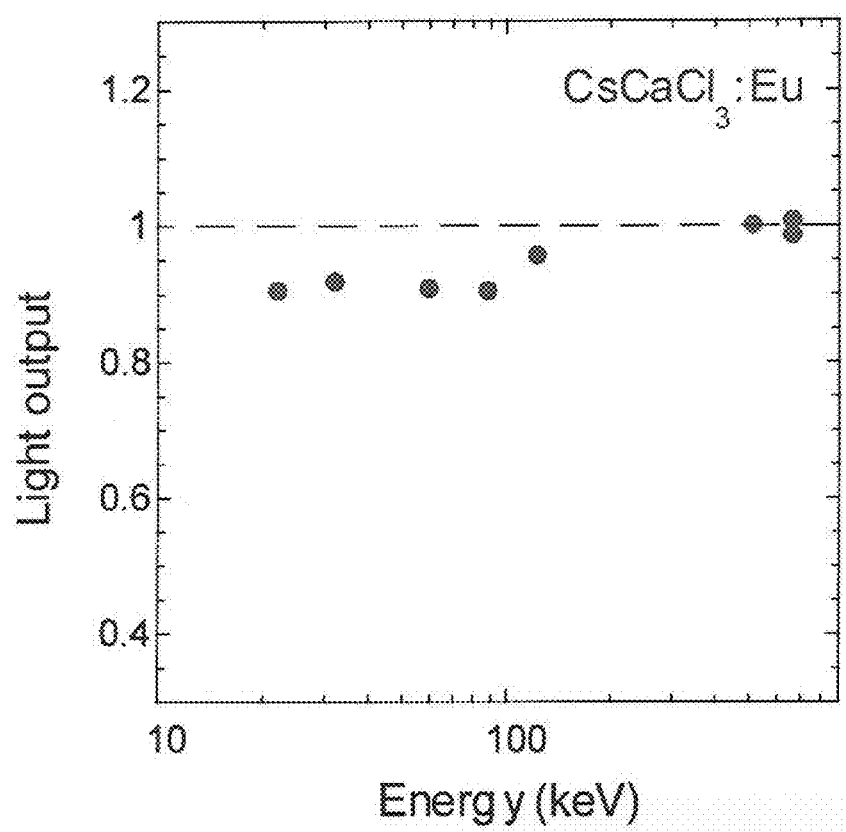

FIG. 15A to 15B are graphs demonstrating light output proportionality whereby FIG. 15A is a graph of light output per keV versus energy in keV for CsSrBr$_3$:Eu and FIG. 15B is a similar graph for CsCaCl$_3$:Eu. The importance of FIG. 15 is that good proportionality contributes to good energy resolution as these graphs demonstrate good proportionality for light output per keV over a wide range of energy level from 10 to 1000 keV.

Figure 16A:
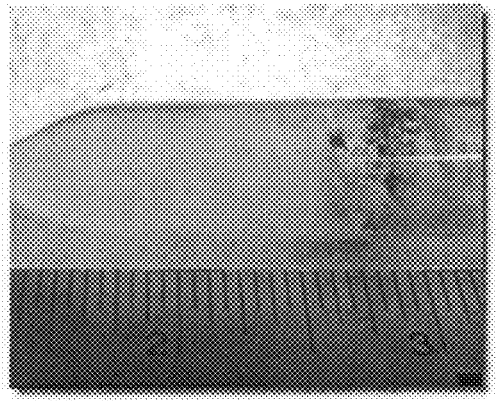
FIG. 16A to 16C are black and white line drawings made from photographs of each respective crystal: $CsSrCl_3$:Eu 10%; $CsSrBr_3$:Eu 10% and $CsCaCl_3$:Eu 10%.
Figure 16A:
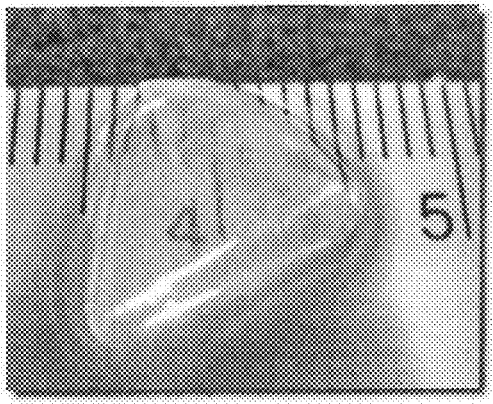
Figure 16B:
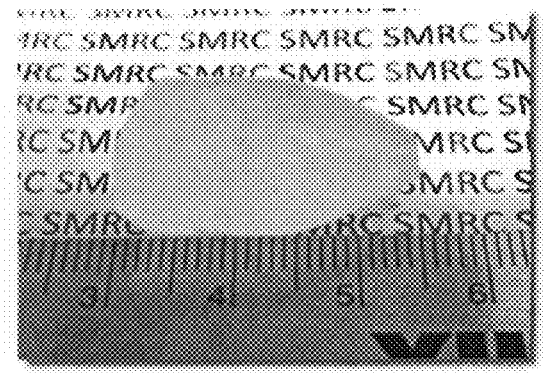
Figure 16B:
Figure 16C:
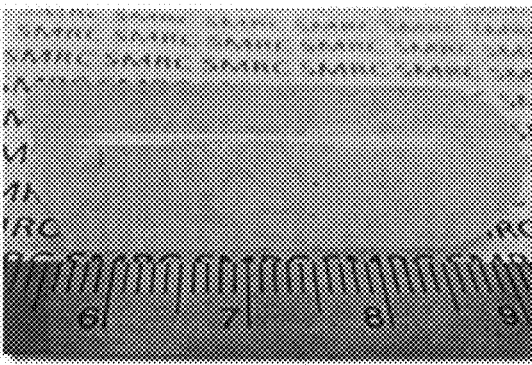
Figure 16C:
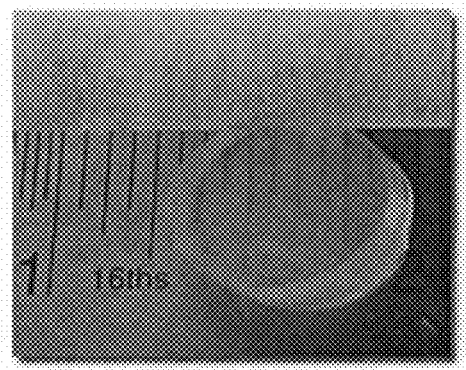

FIG. 16A to 16C are black and white line drawings made from photographs of each respective crystal: CsSrCl$_3$:Eu 10%; CsSrBr$_3$:Eu 10% and CsCaCl$_3$:Eu 10%. CsSrCl$_3$:Eu 10% was grown to be about two inches long; however, some cracking may be seen, possibly due to phase transitions. The crystal was about one centimeter in cross-section. CsSrBr$_3$:Eu 10% was gown to be about two centimeters in length and was relatively clear, colorless and crack-free. Its circular cross-section was just less than 2 centimeters in diameter. CsCaCl$_3$:Eu 10% was grown to be over three centimeters in length. It too was relatively clear, colorless and crack-free. Its circular cross-section measured about 11/16 inch in diameter.

Table 7 provides a summary table for these crystals as follows compared with benchmark NaI:Tl:

TABLE 7

| | CsCaCl$_3$:Eu 10% | CsSrCl$_3$:Eu 10% | CsSrBr$_3$:Eu 10% | NaI:Tl |
|---|---|---|---|---|
| Crystal structure | Cubic | Orthorhombic | Orthorhombic | Cubic |
| Melting point, °C. (approx) | 910 | 842 | 760 | 651 |
| Density, g/cm$^3$ | 2.9 | 3.06 | 3.76 | 3.67 |
| Light yield, ph/Mev (approx) | 18,000 | 46,000 | 31,000 | 38,000 |
| Energy resolution @ 662 kEv, % (approx) | 8.9 | >10 | 6.7 | 7.1 |
| Primary decay time, μsec (approx) | 4.1 | 1.6 | 3.5 | .23 |
| Hygroscopic | Low | Slightly | Low | Very |

The table demonstrates that promising results have been obtained for new, inorganic, single crystals as indicated above when compared with NaL: TI including good transparency, low to no hygroscopicity, good light output and excellent proportionality. It is expected that with greater effort at purification of raw material and optimizing growth parameters that even better results will be achieved.

A combination crystal is now described comprising Cs Sr$_{1-x}$Ba$_x$I$_3$:Eu 1% and 3%. Crystals were grown at x=0.03, 0.06, 0.09, 0.14 and 0.24. All of these combination crystals operated as a scintillator. X-ray radioluminescence exhibited a peak at approximately 448 nm wavelength. The emission bands are characteristic of Eu$^{2+}$5d-4f luminescence. The emission is at a wavelength that is suitable for use with conventional photo detectors such as photo multiplier tubes (PMT's). Ultraviolet/visual excitation and emission were measured with an emission peak at 446 nm. The maximum light output was measured under 662 keV excitation when x was at 3% and Eu mol 1% and measured at approximately 28,000 photons per MeV with 1.9 μsecond decay time, the light output decreased with increasing x such that when x was 24%, the light output approximately 21,000 photons per MeV and the scinitillation decay time approximately 1.5 μseconds.

While various aspects of the present invention have been described above, it should be understood that they have been presented by way of example and not limitation. It will be apparent to persons skilled in the relevant art(s) that various changes in form and detail can be made therein without departing from the spirit and scope of the present invention. Thus, the present invention should not be limited by any of the above described exemplary aspects, but should be defined only in accordance with the following claims and their equivalents.

In addition, it should be understood that the figures in the attachments, which highlight the structure, methodology, functionality and advantages of the present invention, are presented for example purposes only. The present invention is sufficiently flexible and configurable, such that it may be implemented in ways other than that shown in the accompanying figures.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present invention in any way.

What we claim is:

1. A new composition of matter comprising the chemical composition KCa$_{1-y}$i$_3$:yEu wherein y is 0.01 to 0.1 inclusive grown by one of a Bridgman method or a vertical gradient freeze method.

2. A new composition of matter where the new composition of matter comprises RbCa$_{1-y}$I$_3$:yEu where y is 0.01 to 0.1 inclusive grown by one of a Bridgman method or a vertical gradient freeze method.

3. A new composition of matter comprising the chemical composition Cs(Sr$_{1-x}$Ba$_x$)$_{1-y}$I$_3$:yEu where 0.01 is less than or equal to y which is less than or equal to 0.10 and x is greater than or equal to 0.03 and is less than or equal to 0.24.

4. The composition of matter of claim 3, the light yield increasing between approximately 21,000 and 28,000 photons per MeV with decreasing barium concentration under energetic ionizing radiation.

5. A composition of matter comprising KCaI$_3$:Eu and having a light yield in photons per Mev of approximately 60,000 the europium doping comprising approximately 3 mol % upon irradiation with gamma-rays grown by one of a Bridgman method or a vertical gradient freeze method.

6. A scintillator comprising the chemical composition KCa$_{1-y}$I$_3$:yEu wherein y is 0.01 to 0.1 inclusive grown by one of a Bridgman method or a vertical gradient freeze method.

7. A scintillator comprising RbCa$_{l-y}$I$_3$:yEu where y is 0.01 to 0.1 inclusive grown by one of a Bridgman method or a vertical gradient freeze method.

8. A scintillator comprising the chemical composition Cs(Sr$_{1-x}$Ba$_x$)$_{1-y}$I$_3$:yEu where 0.01 is less than or equal to y which is less than or equal to 0.10 an0d x is greater than or equal to 0.03 and is less than or equal to 0.24.

* * * * *

UNITED STATES PATENT AND TRADEMARK OFFICE
CERTIFICATE OF CORRECTION

PATENT NO. : 8,815,119 B2
APPLICATION NO. : 13/351748
DATED : August 26, 2014
INVENTOR(S) : Mariya Zhuravleva and Kan Yang It is certified that error appears in the above-identified patent and that said Letters Patent is hereby corrected as shown below:

In the claims

Column 12, Claim 8, lines 61-62, "which is less than or equal to 0.10 an0d x is greater than or equal to 0.03" should read as follows:

--which is less than or equal to 0.10 and x is greater than or equal to 0.03--

Signed and Sealed this
Fifth Day of April, 2016

Michelle K. Lee
*Director of the United States Patent and Trademark Office*